United States Patent
Motoyama et al.

(10) Patent No.: US 10,297,654 B2
(45) Date of Patent: May 21, 2019

(54) DISPLAY DEVICE AND ELECTRONIC APPARATUS

(71) Applicant: Sony Corporation, Tokyo (JP)

(72) Inventors: Yosuke Motoyama, Kanagawa (JP); Reo Asaki, Tokyo (JP); Shingo Makimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 492 days.

(21) Appl. No.: 14/597,596

(22) Filed: Jan. 15, 2015

(65) Prior Publication Data

US 2015/0221710 A1     Aug. 6, 2015

(30) Foreign Application Priority Data

Feb. 4, 2014   (JP) .................. 2014-019533

(51) Int. Cl.
*H01L 27/32*     (2006.01)

(52) U.S. Cl.
CPC ........ *H01L 27/3272* (2013.01); *H01L 27/322* (2013.01); *H01L 27/3216* (2013.01); *H01L 27/3218* (2013.01)

(58) Field of Classification Search
CPC ............. H01L 27/3272; H01L 27/3216; H01L 27/3218; H01L 27/322
USPC ... 257/40, 59, 72, 79, 88, 89, 258, 290–292, 257/294, 435, 440, 443
See application file for complete search history.

(56) References Cited

U.S. PATENT DOCUMENTS

| | | | | |
|---|---|---|---|---|
| 5,414,547 A * | 5/1995 | Matsuo | ............ | G02F 1/136209 349/44 |
| 6,100,858 A * | 8/2000 | Tran | .......................... | G09G 3/04 345/33 |
| 7,480,022 B2 * | 1/2009 | Tsuchiya | ........... | G02F 1/133512 349/106 |
| 7,773,184 B2 * | 8/2010 | Ono | .................. | G02F 1/133707 349/141 |
| 8,106,343 B2 * | 1/2012 | Arishima | .......... | H01L 27/14623 250/208.1 |
| 8,159,508 B2 * | 4/2012 | Lee | ..................... | H01L 27/3211 313/582 |
| 8,552,635 B2 * | 10/2013 | Kim | ..................... | G09G 3/2003 313/504 |

(Continued)

FOREIGN PATENT DOCUMENTS

| | | |
|---|---|---|
| CN | 101520566 A | 9/2009 |
| CN | 102262854 A | 11/2011 |
| JP | 2011-249334 | 12/2011 |

OTHER PUBLICATIONS

Chinese Office Action dated Sep. 28, 2018 for corresponding Chinese Application No. 201510042518.6.

*Primary Examiner* — Ori Nadav
(74) *Attorney, Agent, or Firm* — Michael Best & Friedrich LLP

(57) ABSTRACT

A display device includes a plurality of pixels that is arrayed in a first direction and a second direction. Each pixel includes; a first sub-pixel, a second sub-pixel that is disposed to be adjacent to the first sub-pixel in the first direction, a third sub-pixel that is disposed to be adjacent to at least one of the first sub-pixel and the second sub-pixel in the second direction, and a light shielding portion that is disposed corresponding to the position on which the third sub-pixel is disposed, so as to limit a viewing angle of the third sub-pixel in the first direction.

17 Claims, 20 Drawing Sheets

(56) References Cited

U.S. PATENT DOCUMENTS

| | | | |
|---|---|---|---|
| 2006/0038948 A1* | 2/2006 | Nishikawa | G02F 1/133707 349/125 |
| 2007/0008242 A1* | 1/2007 | Mori | G02F 1/134309 345/60 |
| 2009/0219458 A1* | 9/2009 | Endo | G02F 1/133512 349/58 |
| 2009/0309821 A1* | 12/2009 | Tanno | G02F 1/133514 345/87 |
| 2010/0085517 A1* | 4/2010 | Hong | G02B 27/22 349/106 |
| 2010/0328360 A1* | 12/2010 | Miyashita | G09G 3/3614 345/690 |
| 2011/0211146 A1* | 9/2011 | Uehara | G02F 1/134363 349/106 |
| 2012/0038267 A1* | 2/2012 | Hanamura | H01L 27/322 313/504 |
| 2014/0292622 A1* | 10/2014 | Lee | G09G 3/3233 345/80 |

* cited by examiner

DISPLAY DEVICE AND ELECTRONIC APPARATUS

CROSS REFERENCE TO RELATED APPLICATIONS

This application claims the benefit of Japanese Priority Patent Application JP 2014-019533 filed Feb. 4, 2014, the entire contents of which are incorporated herein by reference.

BACKGROUND

The present disclosure relates to a display device that includes a plurality of sub-pixels in one pixel, and an electronic apparatus using such a display device.

A stripe array structure and a delta array structure are known as pixel array structures in a display device in which an organic electro-luminescence (EL) element or the like is used. As another structure, a pixel array structure disclosed in Japanese Unexamined Patent Application Publication No. 2011-249334 is known.

SUMMARY

A delta array structure is advantageous for a wide opening of a pixel for achieving a long lifetime and a wide viewing angle. However, it is difficult to avoid a jagged feel of a line pattern in a row direction and a column direction of the pixel. On the other hand, in a case where a stripe array structure is adopted, the jagged feeling can be avoided. However, the total length for sub-pixels for color separation in one pixel becomes long, and the opening ratio decreases, and then, a luminance and the life time deteriorate.

Therefore, as disclosed in Japanese Unexamined Patent Application Publication No. 2011-249334, a pixel array structure is proposed, in which a high resolution is realized and the opening ratio is ensured. In the pixel array structure disclosed in Japanese Unexamined Patent Application Publication No. 2011-249334, a first sub-pixel and a second sub-pixel are formed on one column in one pixel and a third sub-pixel is formed on two rows adjacent to the first sub-pixel and the second sub-pixel, and thus, the opening ratio is improved. In this pixel array structure, an opening width of the third sub-pixel in the row direction is larger than the opening widths of the first sub-pixel and the second sub-pixel.

However, in the pixel array structure disclosed in Japanese Unexamined Patent Application Publication No. 2011-249334, since the opening width of the third sub-pixel is different from that of the first and second sub-pixels in the row direction, the viewing angle characteristics deteriorate. As an actual phenomenon, a variation in color variation occurs at the time of full-color emission (white light emitting). This phenomenon appears more prominent as a pixel pitch becomes smaller, and the color tone of an image viewed from front of a display panel and a color tone of an image viewed at an angle are different from each other. Therefore, the viewing angle characteristics deteriorate compared to the stripe array structure and the delta array structure in which the opening widths of the sub-pixels of each color are the same. This phenomenon is prominently seen in a high-resolution panel of higher than 2000 ppi, and it has become a major issue in recent years in which a high-resolution display is desired. Particularly, the resolution of a display panel used in a view finder or a head mounting display has already reached higher than a 2000 ppi range, and it has become clear that a display panel for such application decreases the quality of the panel.

It is desirable to provide a display device and an electronic apparatus in which both a wide opening and a wide viewing angle can be achieved.

According to the present disclosure, there is provided a display device which includes a plurality of pixels that is arrayed in a first direction and a second direction. Each pixel includes a first sub-pixel, a second sub-pixel that is disposed to be adjacent to the first sub-pixel in the first direction, a third sub-pixel that is disposed to be adjacent to at least one of the first sub-pixel and the second sub-pixel in the second direction, and a light shielding portion that is disposed corresponding to the position on which the third sub-pixel is disposed, so as to limit a viewing angle of the third sub-pixel in the first direction.

According to the present disclosure, there is provided an electronic apparatus which includes a display device on which a plurality of pixels is arrayed in a first direction and a second direction. Each pixel includes a first sub-pixel, a second sub-pixel that is disposed to be adjacent to the first sub-pixel in the first direction, a third sub-pixel that is disposed to be adjacent to at least one of the first sub-pixel and the second sub-pixel in the second direction, and a light shielding portion that is disposed corresponding to the position on which the third sub-pixel is disposed, so as to limit a viewing angle of the third sub-pixel in the first direction.

In the display device or the electronic apparatus according to the present disclosure, a viewing angle of the third sub-pixel in a first direction is limited by the light shielding portion.

According to a display device and an electronic apparatus in the present disclosure, since a viewing angle of a third sub-pixel in a first direction is limited by the light shielding portion, it is possible to achieve both the wide opening and the wide viewing angle.

The effect described here is not necessarily limited hereto, and may be any of the effects described in this disclosure.

DETAILED DESCRIPTION OF EMBODIMENTS

Figure 36:
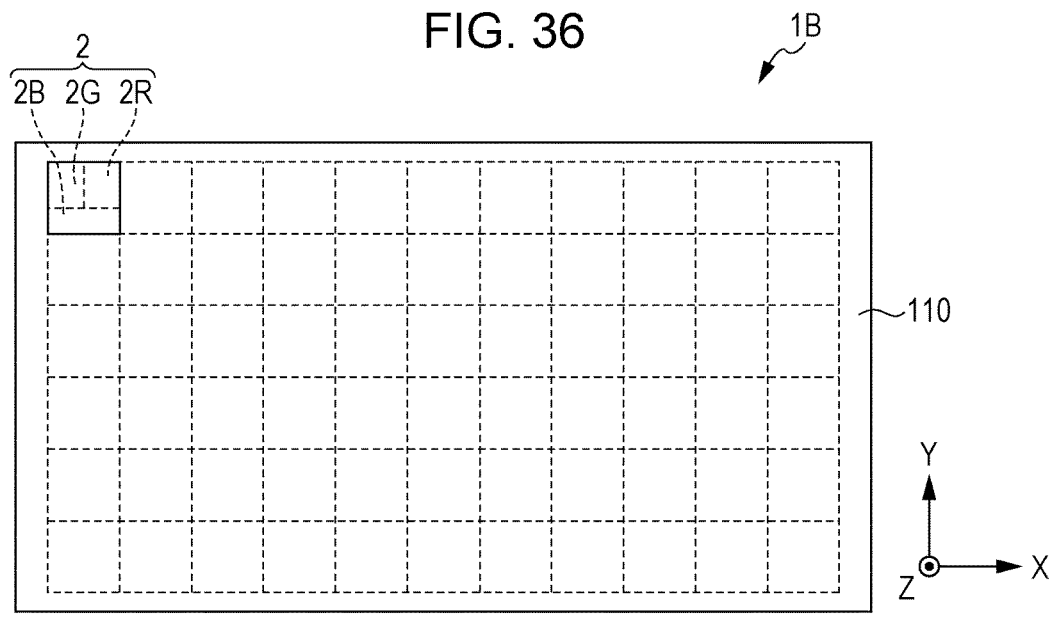
FIG. 36 is a plan view illustrating another configuration example of the display device.
Figure 37:
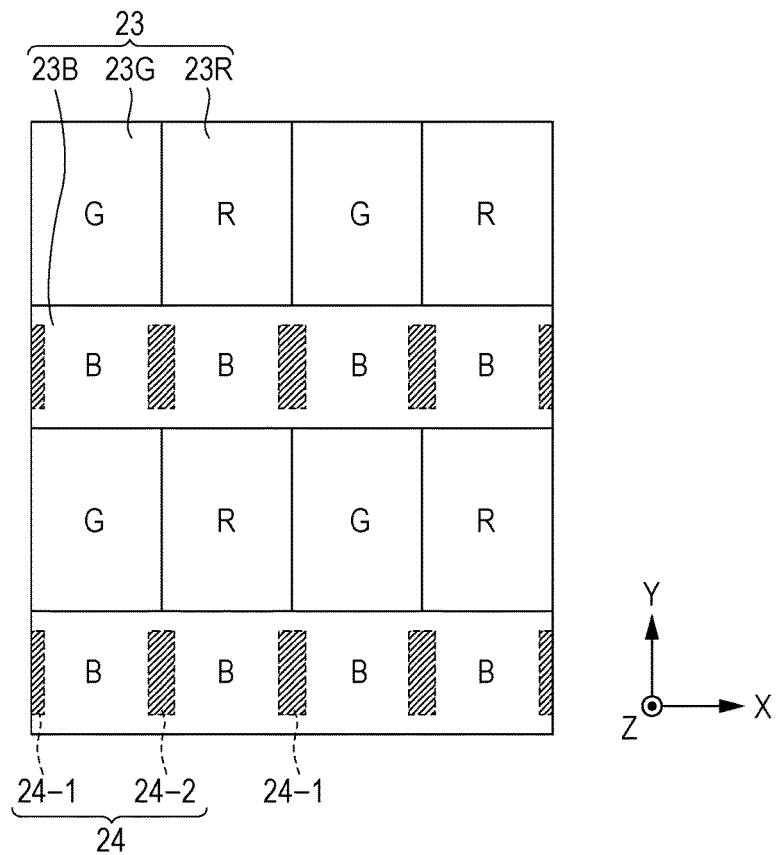
FIG. 37 is a plan view illustrating an example of an array structure of a color filter portion of a pixel in the display device FIG. 36.

Hereinafter, embodiments of the present disclosure will be described in details with reference to the drawings. The description will be made in following order.
1. First embodiment (an example in which a light shielding portion is disposed in a center portion in one pixel)
1.1 Configuration (FIG. 1 to FIG. 9)
1.2 Specific design example (FIG. 10 to FIG. 14)
1.3 Effects
1.4 Modification examples
1.4.1 First modification example (FIG. 16)
1.4.2 Second modification example (FIG. 17)
1.4.3 Third modification example (FIG. 18 and FIG. 19)
1.4.4 Fourth modification example (FIG. 20)
1.4.5 Fifth modification example (FIG. 21)
2. Second embodiment (an example in which a light shielding portion is disposed in a position other than a center portion in one pixel) (FIG. 22 to FIG. 25)
2.1 Configuration
2.2 Acts and effects
3. Third embodiment (an example of a 4-color type display device) (FIG. 26 to FIG. 32)
3.1 First example of an array structure of a pixel
3.2 Second example of an array structure of a pixel
4. Application example of a display device to an electric apparatus (FIG. 33 to FIG. 35)
4.1 First application example (FIG. 33)
4.2 Second application example (FIG. 34 and FIG. 35)
5. Other embodiments (FIG. 36 and FIG. 37)

1. First Embodiment 1.1 Configuration

Overall Configuration of a Display Device 1

Figure 1:
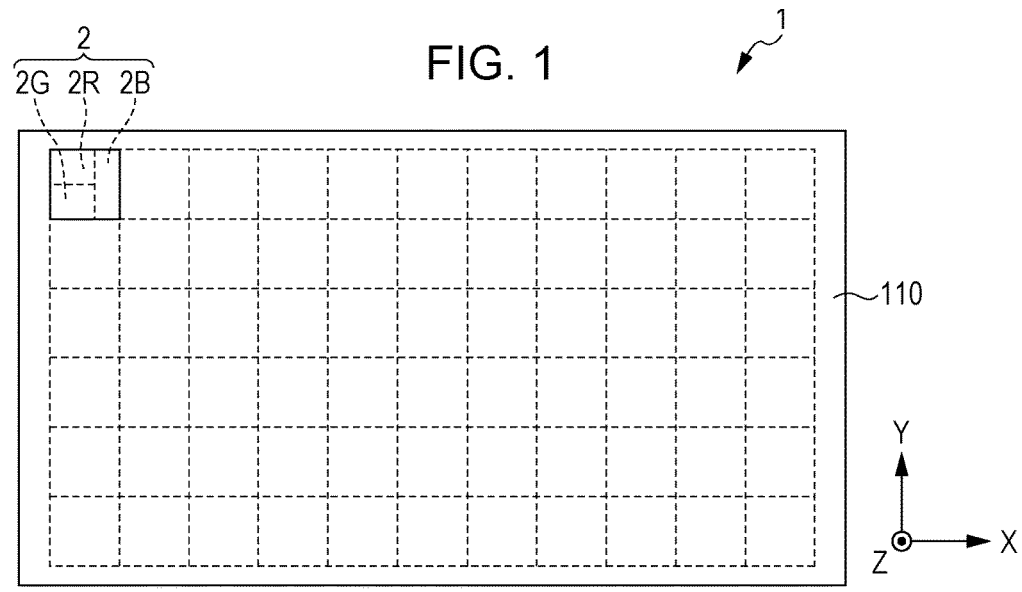
FIG. 1 is a plan view illustrating an example of a display device in a first embodiment of the present disclosure.

FIG. 1 illustrates an example of a planar configuration of a display device 1 in the first embodiment of the present disclosure. The display device 1 is used in a television or the like, and has a configuration in which a plurality of pixels 2 is disposed in a matrix shape in a first direction and a second direction in a display area 110.

Each of the pixels 2 includes a first sub-pixel 2R, a second sub-pixel 2G, and a third sub-pixel 2B. The first sub-pixel 2R and the second sub-pixel 2G are disposed to be adjacent to each other in the first direction. The third sub-pixel 2B is disposed to be adjacent to both the first sub-pixel 2R and the second sub-pixel 2G in the second direction.

In the present embodiment, an array structure of the pixel 2 will be described with the first direction as a vertical direction (Y direction) in the display surface and the second direction as a lateral direction (X direction) in the display plane. The display plane means a plane (XY plane) parallel to a sheet surface in FIG. 1. In addition, for example, in FIG. 1, the description will be made with a direction perpendicular to the sheet surface as the Z direction, that is, a thickness direction of pixel 2 as the Z direction.

The arraying of the sub-pixels is not limited to the illustrated example, but, for example, the first sub-pixel 2R and the second sub-pixel 2G may be disposed in reverse. That is, the first sub-pixel 2R may be disposed to be adjacent to the lower side of the second sub-pixel 2G.

Array Structure of the Pixel 2

Figure 2:
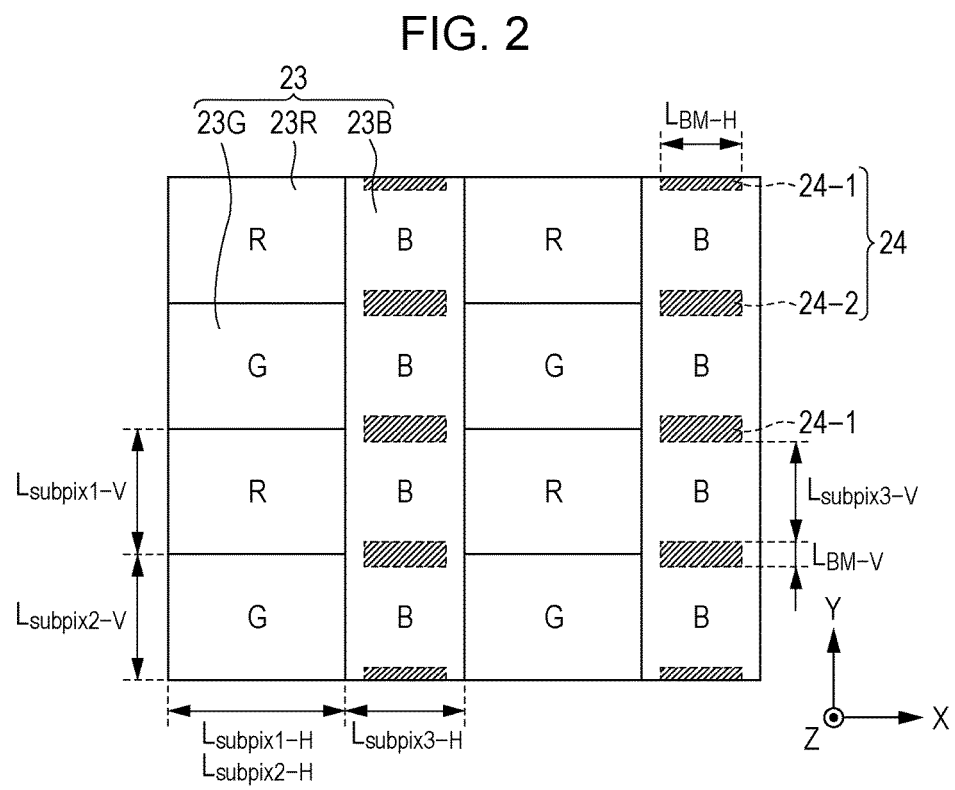
FIG. 2 is a plan view illustrating an example of an array structure of a color filter portion of a pixel in the display device illustrated in FIG. 1.
Figure 3:
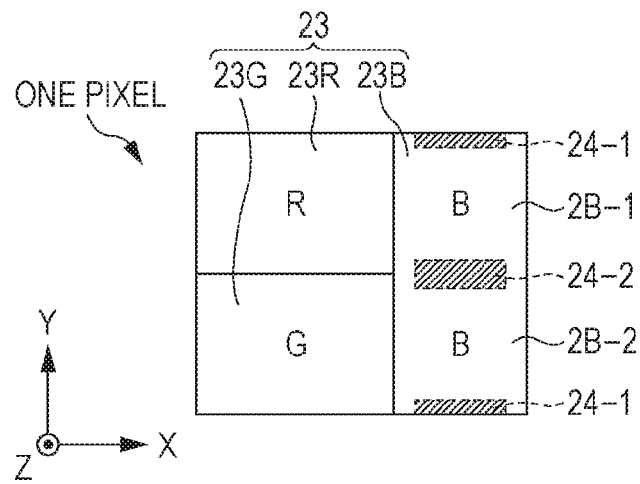
FIG. 3 is a plan view illustrating an example of a configuration of a color filter portion for one pixel in the display device illustrated in FIG. 1.
Figure 4:
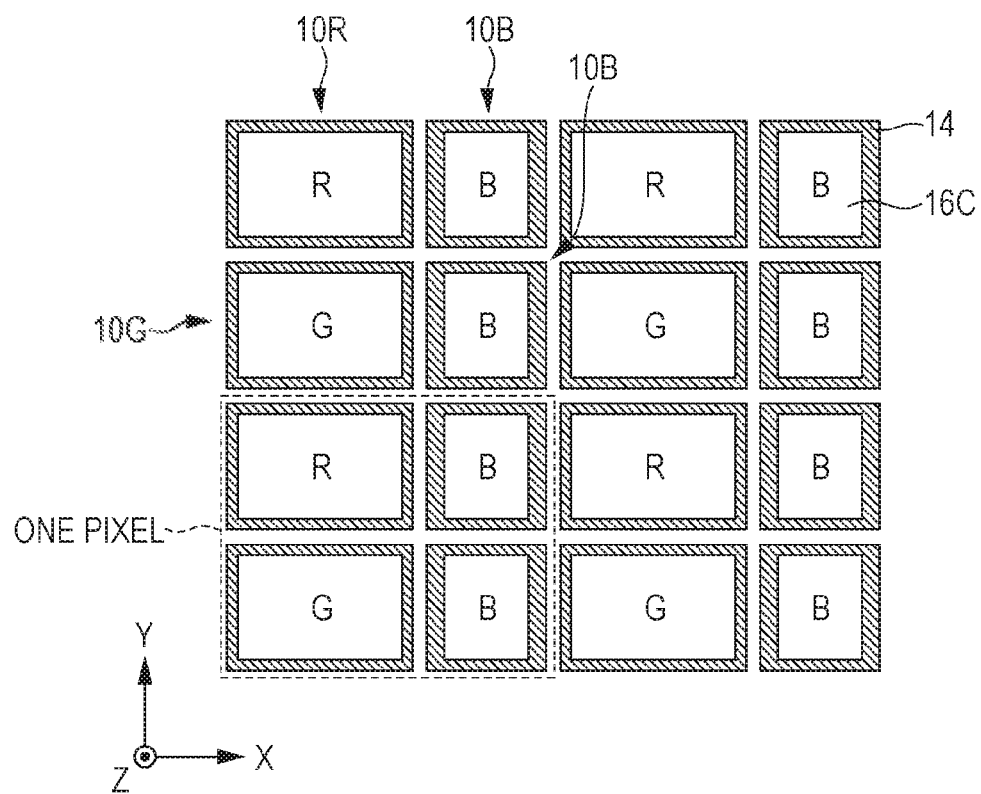
FIG. 4 is a plan view illustrating an example of an array structure of a light emitting element in the display device illustrated in FIG. 1.
Figure 5:
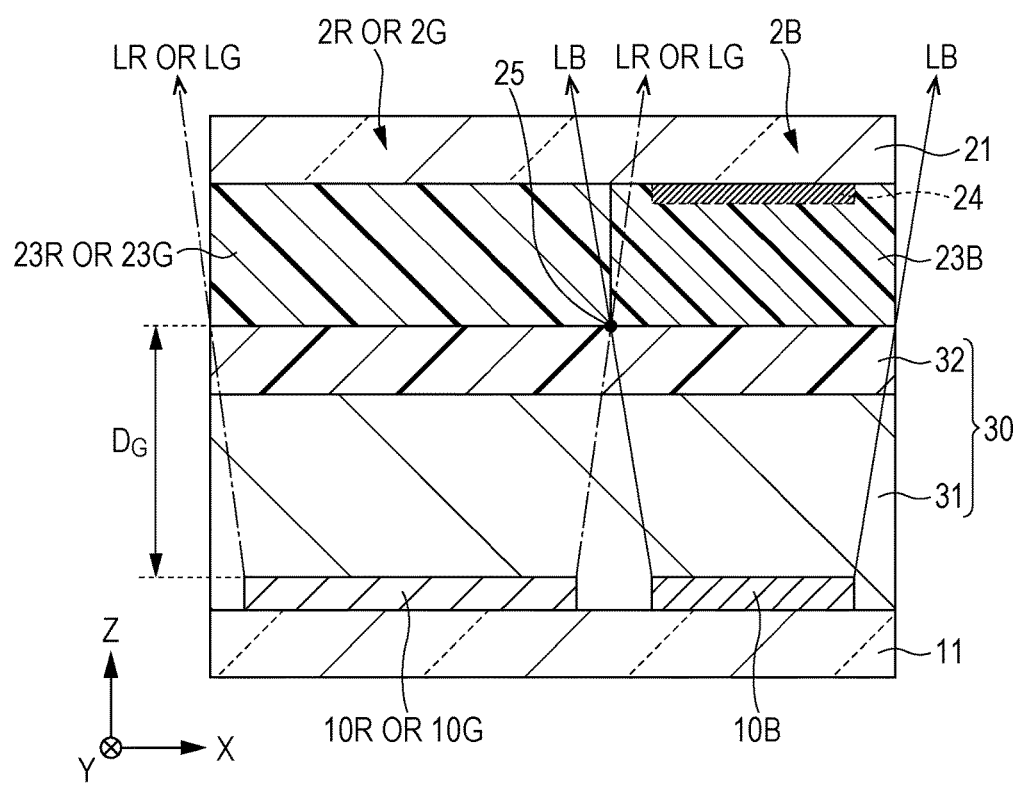
FIG. 5 is a sectional view illustrating an example of a sectional structure of a pixel in the display device illustrated in FIG. 1.

Each pixel 2 includes a light emitting element that emits a predetermined color light and a color filter 23 that transmits a predetermined color light. FIG. 2 illustrates an example of an array structure of a color filter portion of the pixel 2 in the display device 1. FIG. 3 illustrates an example of a configuration of the color filter portion for one pixel. FIG. 4 illustrates an example of the array structure of the light emitting element of the pixel 2. FIG. 5 illustrates an example of the sectional structure of the pixel 2.

The first sub-pixel 2R includes a first light emitting element 10R (FIG. 4 and FIG. 5) that emits a first color light LR and a first color filter 23R (FIG. 2, FIG. 3, and FIG. 5) that transmits the first color light LR from the first light emitting element 10R. The second sub-pixel 2G includes a second light emitting element 10G (FIG. 4 and FIG. 5) that emits a second color light LG and a second color filter 23G (FIG. 2, FIG. 3, and FIG. 5) that transmits the second color light LG from the second light emitting element 10G. The third sub-pixel 2B includes a third light emitting element 10B (FIG. 4 and FIG. 5) that emits a third color light LB which has a shorter wavelength than the first color light LR and the second color light LG and a third color filter 23B (FIG. 2, FIG. 3, and FIG. 5) that transmits the third color light LB from the third light emitting element 10B.

The first light emitting element 10R emits, for example, a red color light as the first color light LR. The second light emitting element 10G emits, for example, a green color light as the second color light LG. The third light emitting element 10B emits, for example, a blue color light as the third color light LB. Each of the first light emitting element 10R, the second light emitting element 10G, and the third light emitting element 10B can be formed of an inorganic EL element, a semiconductor laser, or a light emitting diode (LED) in addition to an organic EL element described below.

In each pixel 2, a light shielding portion 24 is provided as a black matrix. The light shielding portion 24 is disposed corresponding to the position on which the third sub-pixel 2B is disposed, so as to limit the viewing angle of the third sub-pixel 2B in the first direction (Y direction). The light shielding portion 24, as illustrated in FIG. 2 and FIG. 3, is made from a first light shielding part 24-1 and a second light shielding part 24-2. The first light shielding part 24-1 is provided on a boundary portion of the adjacent pixels in the first direction. The second light shielding part 24-2 is provided on the center portion in the third sub-pixel 2B in one pixel. In this way, in the one pixel, a first pixel area 2B-1 and a second pixel area 2B-2 are formed in the third sub-pixel 2B with the second light shielding part 24-2 as the boundary.

It is preferable that the planar shape of the first light emitting element 10R, the second light emitting element 10G, and the third light emitting element 10B be a shape corresponding to the position on which the color filter 23 and the light shielding portion 24 are disposed as illustrated in FIG. 4. It is preferable that, in one pixel, the third light emitting element 10B be divided at the portion corresponding to the position on which the second light shielding part 24-2 is provided. A width of the third light emitting element 10B and a width of the light shielding portion 24 in the second direction may be different from each other. The first light emitting element 10R, the second light emitting element 10G, and the third light emitting element 10B (light emitting surface) may include a light emitting layer 16C and a lower electrode 14 (reflection surface).

The light shielding portion 24 is formed of a black resin film mixed with a black coloring agent and of which the optical density is one or higher, or a thin film filter using interference of the thin film. It is preferable to use the black resin film since it can form the light shielding portion 24 inexpensively and easily. The thin film filter is formed by laminating a thin film made from metal, metal nitride, or metal oxide in one or more layers, and attenuates the light using the interference of the thin film. As the thin film filter, specifically, a film in which chromium and chromium oxide (III) ($Cr_2O_3$) are alternately laminated can be included.

The color filter 23 is formed of, for example, resin mixed with pigment. By selecting the pigment, the light transmittance can be adjusted such that the light transmittance in the wavelength band of the targeted color is high and the light transmittance in the other wavelength band is low.

As illustrated in FIG. 5, the light emitting elements 10R, 10G, and 10B are provided on a first substrate 11. The light shielding portion 24 and the color filter 23 are provided on a second substrate 21. The first substrate 11 and the second substrate 21 are formed of glass, a silicon (Si) wafer, resin, or the like. The first substrate 11 and the second substrate 21 are disposed opposite each other with the light emitting elements 10R, 10G, 10B, and the light shielding portion 24 and the color filter 23 to the inside, and an intermediate layer 30 made from a resin layer 32 and a protection film 31 is provided between the two substrates.

As illustrated in FIG. 5, with regard to the first sub-pixel 2R and the third sub-pixel 2B, a color separation is mutually performed in the second direction with a color boundary 25 of the first color filter 23R and the third color filter 23B as a boundary. Similarly, with regard to the second sub-pixel 2G and the third sub-pixel 2B, a color separation is mutually performed in the second direction with the color boundary 25 of the second color filter 23G and the third color filter 23B as a boundary. Similarly, with regard to the first sub-pixel 2R and the second sub-pixel 2G, a color separation is mutually performed in the first direction with the color boundary 25 of the first color filter 23R and the second color filter 23G as a boundary.

In this way, in the first sub-pixel 2R and the second sub-pixel 2G, the color separation is performed in both the first direction and the second direction by the color filter 23. That is, by the color filter 23, the color separation is performed between the pixels and between the sub-pixels. For this reason, with regard to the first sub-pixel 2R and the second sub-pixel 2G, the viewing angle is limited by the color filter 23 in both the first direction and the second direction.

On the other hand, the third sub-pixel 2B has a configuration in which the color separation is performed by the color filter 23 in the second direction, but the color separation is not performed in the first direction. That is, with regard to the third sub-pixel 2B, the viewing angle is limited by the color filter 23 the second direction, but the viewing angle is not limited in the first direction. With regard to the third sub-pixel 2B, the viewing angle in the first direction is limited by the light shielding portion 24. In this way, the viewing angle characteristics in the direction where the color separation is not performed are improved.

In FIG. 2, $L_{BM-H}$ indicates a width of the light shielding portion 24 in the lateral direction, and $L_{BM-V}$ indicates a width of the light shielding portion 24 in the vertical direction. $L_{subpix1-H}$ indicates an opening width of the first sub-pixel 2R in the lateral direction and $L_{subpix1-V}$ indicates an opening width of the first sub-pixel 2R in the vertical direction. $L_{subpix2-H}$ indicates an opening width of the second sub-pixel 2G in the lateral direction and $L_{subpix2-V}$ indicates an opening width of the second sub-pixel 2G in the vertical direction.

In addition, $L_{subpix3-H}$ indicates an opening width of the third sub-pixel 2B in the lateral direction and $L_{subpix3-V}$ indicates an opening width of the third sub-pixel 2B in the vertical direction. Here, the opening width of the third sub-pixel 2B indicates each of the opening widths of the first pixel area 2B-1 and the second pixel area 2B-2 of the third sub-pixel 2B. In the present embodiment, since the light shielding portion 24 is provided on the center portion in the third sub-pixel 2B in the first direction and on the boundary portion of one pixel, sizes of opening widths $L_{subpix3-V}$ of each of the first pixel area 2B-1 and the second pixel area 2B-2 in the vertical direction are the same.

In the second direction, it is preferable that the width of the light shielding portion 24 be less than the opening width of the third sub-pixel 2B. For example, it is preferable that the light shielding portion 24 have a basic shape of rectangles with the direction separating the color of the third sub-pixel 2B (the second direction) as the major axis, and as illustrated in Formula 1, it is preferable that the length of the major axis be less than the opening width of the third sub-pixel 2B.

$$L_{BM-H} < L_{subpix3-H} \quad \text{(Formula 1)}$$

In addition, as illustrated Formula 2 below, it is preferable that the opening width of the first sub-pixel 2R and opening width of the second sub-pixel 2G be larger than the opening width of the third sub-pixel 2B in the direction where color separation is performed.

$$L_{subpix3-H} < L_{subpix1-H}$$

$$L_{subpix3-H} < L_{subpix2-H} \quad \text{(Formula 2)}$$

Because the extraction of the light decreases, it is preferable that the light shielding portion 24 not be disposed on the boundary portion (the color boundary 25) of each of the color filters 23R, 23G, and 23B. As described above, it is preferable that, in one pixel, the third light emitting element 10B be divided at the portion corresponding to the position on which the second light shielding part 24-2 is provided (FIG. 4). The reason for dividing the third light emitting element 10B in one pixel is to avoid the phenomenon that the light emitted from the third light emitting element 10B is reflected at the second light shielding part 24-2, interferes in the cell of the display panel, and then, generates an unexpected peak.

Configuration of a Drive Circuit of the Pixel 2 and the Light Emitting Diode

Figure 6:
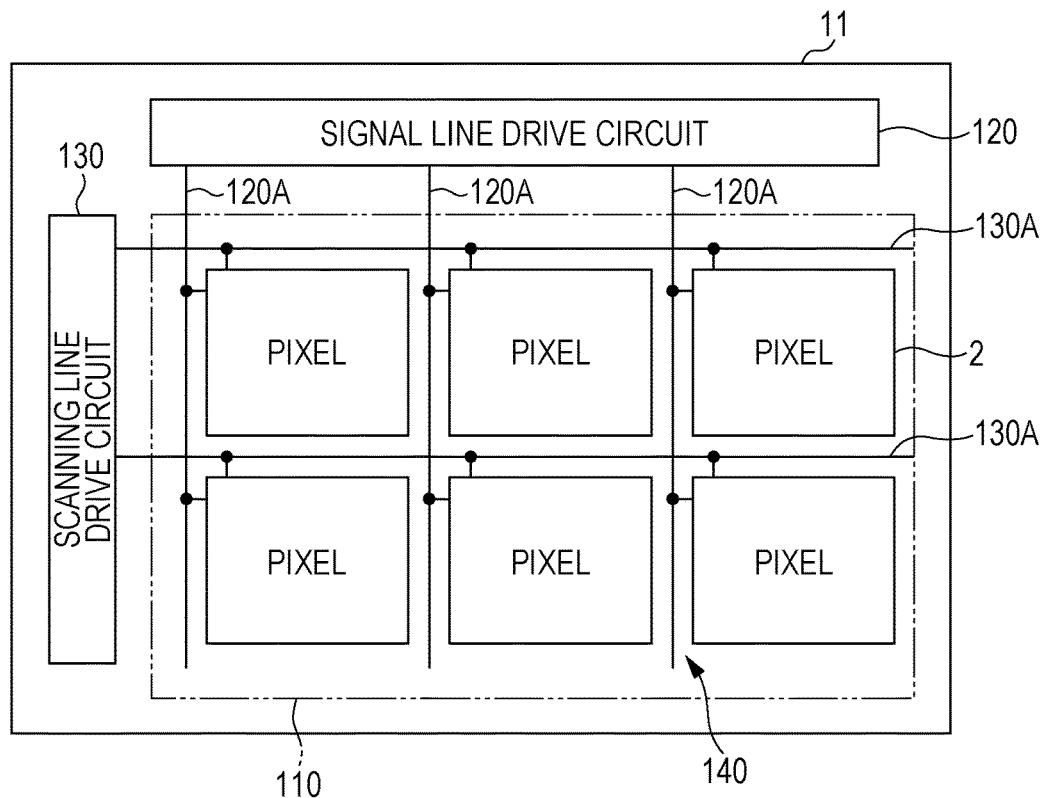
FIG. 6 is a block diagram illustrating an example of a circuit configuration of the display device illustrated in FIG. 1.
Figure 7:
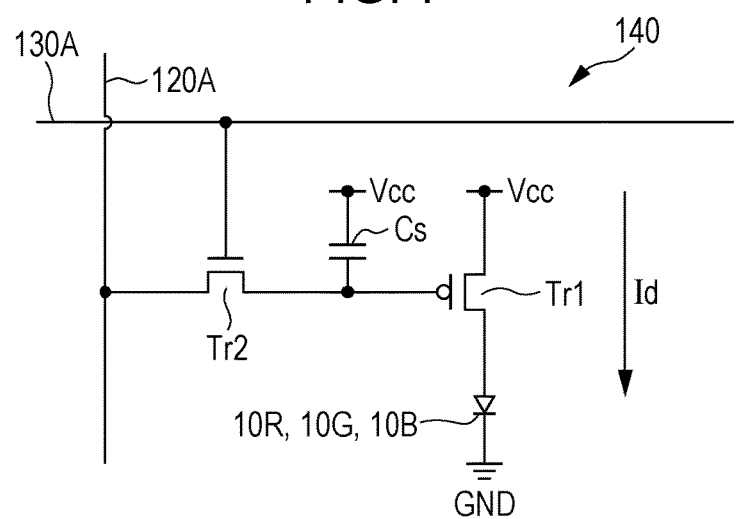
FIG. 7 is a circuit diagram illustrating an example of a drive circuit of a pixel in the display device illustrated in FIG. 1.

FIG. 6 illustrates an example of a circuit configuration of the display device 1. FIG. 7 illustrates an example of a drive circuit of the pixel 2 in the display device 1. The display device 1 is a device used as an organic EL television apparatus which includes organic elements as the light emitting element 10R, 10G, and 10B, and for example, includes a signal line drive circuit 120 and a scanning line drive circuit 130 in the vicinity of the display area 110, which are drivers for the image displaying.

In the display area 110, a pixel drive circuit 140 is provided. FIG. 7 illustrates an example of the pixel drive circuit 140. The pixel drive circuit 140 is an active-type drive circuit formed on a lower layer of the lower electrode 14 described below. That is, the pixel drive circuit 140 includes a drive transistor Tr1 and a write transistor Tr2, a capacitor (holding capacitance) Cs between the transistors Tr1 and Tr2, and the light emitting element 10R (or 10G or 10B) that is connected to the drive transistor Tr1 in series between a first power supply line (Vcc) and a second power supply line (GND). The drive transistor Tr1 and the write transistor Tr2 are formed of general thin film transistors, and a configuration thereof is not particularly limited, that is, may be, for example, an inverted staggered structure (so-called a bottom-gate type) or may be a staggered structure (a top-gate type).

In the pixel drive circuit 140, a plurality of signal lines 120A is disposed in a column direction and a plurality of scanning lines 130A is disposed in a row direction. An intersection of each signal line 120A and each scanning line 130A corresponds to any one (sub-pixel) of the light emitting element 10R, 10G, and 10B. Each signal line 120A is connected to the signal line drive circuit 120, and an image signal is supplied to a source electrode of the write transistor Tr2 from the signal line drive circuit 120 via the signal line 120A. Each scanning line 130A is connected to the scanning line drive circuit 130, and a scanning signal is sequentially supplied to a gate of the write transistor Tr2 from the scanning line drive circuit 130 via the scanning line 130A.

Figure 8:
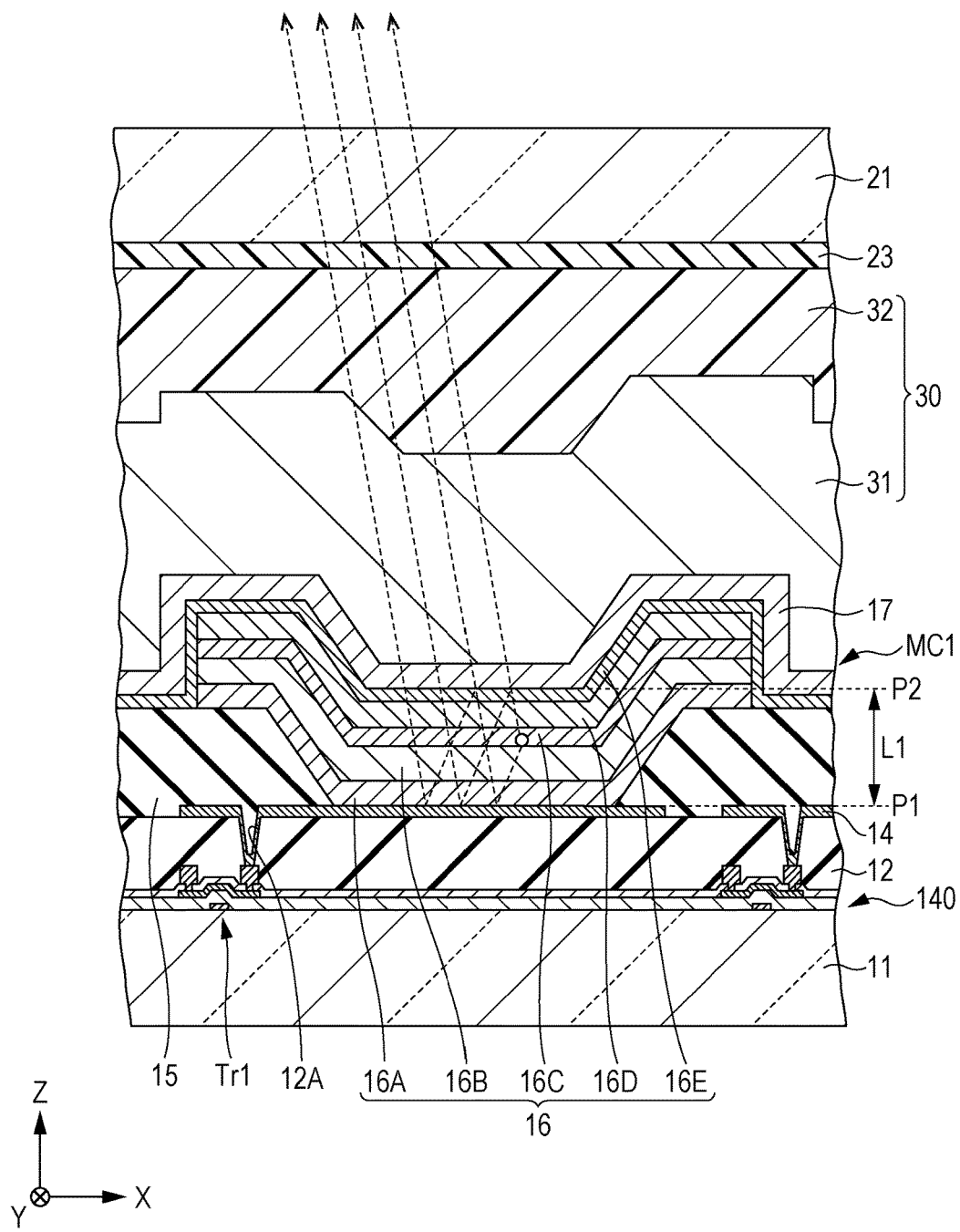
FIG. 8 is a sectional view illustrating an example of a sectional structure of a light emitting element of a pixel in the display device illustrated in FIG. 1.

FIG. 8 illustrates a sectional configuration of the light emitting elements 10R, 10G, and 10B. The light emitting elements 10R, 10G, and 10B are light emitting elements in which an organic layer 16 that includes the drive transistor Tr1 of the pixel drive circuit 140, a flattening insulation film 12, the lower electrode 14 as an anode, an inter-electrode insulation film 15, and the light emitting layer 16C described below; and an upper electrode 17 as a cathode; are respectively deposited in the above order from the first substrate 11 side. The drive transistor Tr1 is electrically connected to the lower electrode 14 via the connection hole 12A provided on the flattening insulation film 12.

The light emitting element 10R, 10G, and 10B are covered by a protection film 31, and then are sealed by the second substrate 21 bonded over the whole surface of the protection film 31 with the resin layer 32 therebetween. The protection film 31 is formed of silicon nitride (SiNx), silicon oxide, metal oxide, or the like. The resin layer 32 is formed of, for example, thermosetting resin or ultraviolet curable resin. The above-described intermediate layer 30 is formed of the protection film 31 and the resin layer 32.

The flattening insulation film 12 flattens the surface of the first substrate 11 on which the pixel drive circuit 140 is formed, and it is preferable that the flattening insulation film 12 is formed of a material having a high pattern accuracy because a fine connection hole 12A is provided thereon. As the forming material for the flattening insulation film 12, for example, an organic materials such as polyamide, or an inorganic materials such as silicon oxide ($SiO_2$) can be included.

The lower electrode 14 also functions as a reflection layer, and it is desirable that the reflection rate be as high as possible for enhancing the efficiency of the light emission. Particularly, in a case where the lower electrode 14 is used as an anode, it is desirable that the lower electrode 14 be formed of a material having an improved hole injection property. A single or an alloy of the metal element such as chromium (Cr), gold (Au), platinum (Pt), nickel (Ni), copper (Cu), tungsten (W), or silver (Ag) having a thickness in a deposition direction (hereinafter, simply referred to as thickness) equal to or greater than 100 nm and equal to or less than 1000 nm can be included as examples of the lower electrode 14. A transparent conduction film such as indium tin oxide (ITO) may be provided on the surface of the lower electrode 14. A material having a high reflection rate, but having a problem of a hole injection barrier due to the existence of oxide film on the surface or a low work function such as aluminum (Al) alloy can be used as the lower electrode 14 by providing an appropriate hole injection layer.

The inter-electrode insulation film 15 is for ensuring the insulation between the lower electrode 14 and the upper electrode 17 and making the light emitting area as a desired shape, and for example, is formed of photosensitive resin. The inter-electrode insulation film 15 is provided only around the lower electrode 14, and the area of the lower electrode 14 exposed from the inter-electrode insulation film 15 is the light emitting area. The organic layer 16 and the upper electrode 17 are also provided on the inter-electrode insulation film 15, but the light emitting occurs only from the light emitting area.

The organic layer 16 has a configuration in which a hole injection layer 16A, a hole transport layer 16B, the light emitting layer 16C, an electron transport layer 16D, and an the electron injection layer 16E are deposited in order from the lower electrode 14. Among the above, the layer other than the light emitting layer 16C may be provided if necessary. The organic layer 16 may have a different configuration according to the respective emitting colors of the light emitting element 10R, 10G, and 10B. The hole injection layer 16A is a buffer layer for enhancing hole injection efficiency and preventing leakage. The hole transport layer 16B is a layer for enhancing hole transfer efficiency to the light emitting layer 16C. The light emitting layer 16C is a layer that emits the light when the electric potential is applied and a recombination between the electrons and holes occurs. The electron transport layer 16D is a layer for enhancing hole transfer efficiency to the light emitting layer 16C. The electron injection layer 16E is a layer for enhancing electron injection efficiency.

The thickness of the upper electrode 17 is approximately 10 nm, and is formed of an alloy of aluminum (Al), magnesium (Mg), calcium (Ca), or sodium (Na). Among the above, since the electric conductivity is high and the absorption is small at the thin film state, the alloy (alloy of Mg—Ag) of the magnesium and silver is preferable. The rate Mg:Ag of the alloy of Mg—Ag is not particularly limited, but it is desirable to be in a range of approximately 20:1 to 1:1 on a film thickness basis. In addition, the material of the upper electrode 17 may be an alloy (alloy of Al—Li) of aluminum (Al) and lithium (Li).

The upper electrode 17 has a function of a semi-permeable reflection layer as well. That is, the light emitting elements 10R, 10G, and 10B include a resonator structure MC1, and the light generated at the light emitting layer 16C is resonated by the resonator structure MC1 between the lower electrode 14 and the upper electrode 17. The resonator structure MC1 resonates the light generated at the light emitting layer 16C and extracts from a semi-permeable reflection surface P2 with the interface between the lower electrode 14 and the organic layer 16 as a reflection surface P1, the interface between an intermediate layer 18 and the electron injection layer 16E as the semi-permeable reflection surface P2, and the organic layer 16 as a resonating portion. In this way, if the resonator structure MC1 is included, the light generated at the light emitting layer 16C is multiply interfered, a half value width of a spectrum of light extracted from the semi-permeable reflection surface P2 side decreases, and then, the peak intensity can be increased. That is, the light emission intensity in front direction increases, and thus, color purity of the light emission can be improved.

Between the reflection surface P1 and the semi-permeable reflection surface P2, there exists a position (a resonance surface) on which the extracted light emission intensity becomes maximum. It is preferable that an optical distance L1 between the reflection surface P1 and the semi-permeable reflection surface P2 satisfy a predetermined condition so as to enhance the extraction efficiency.

Figure 9:
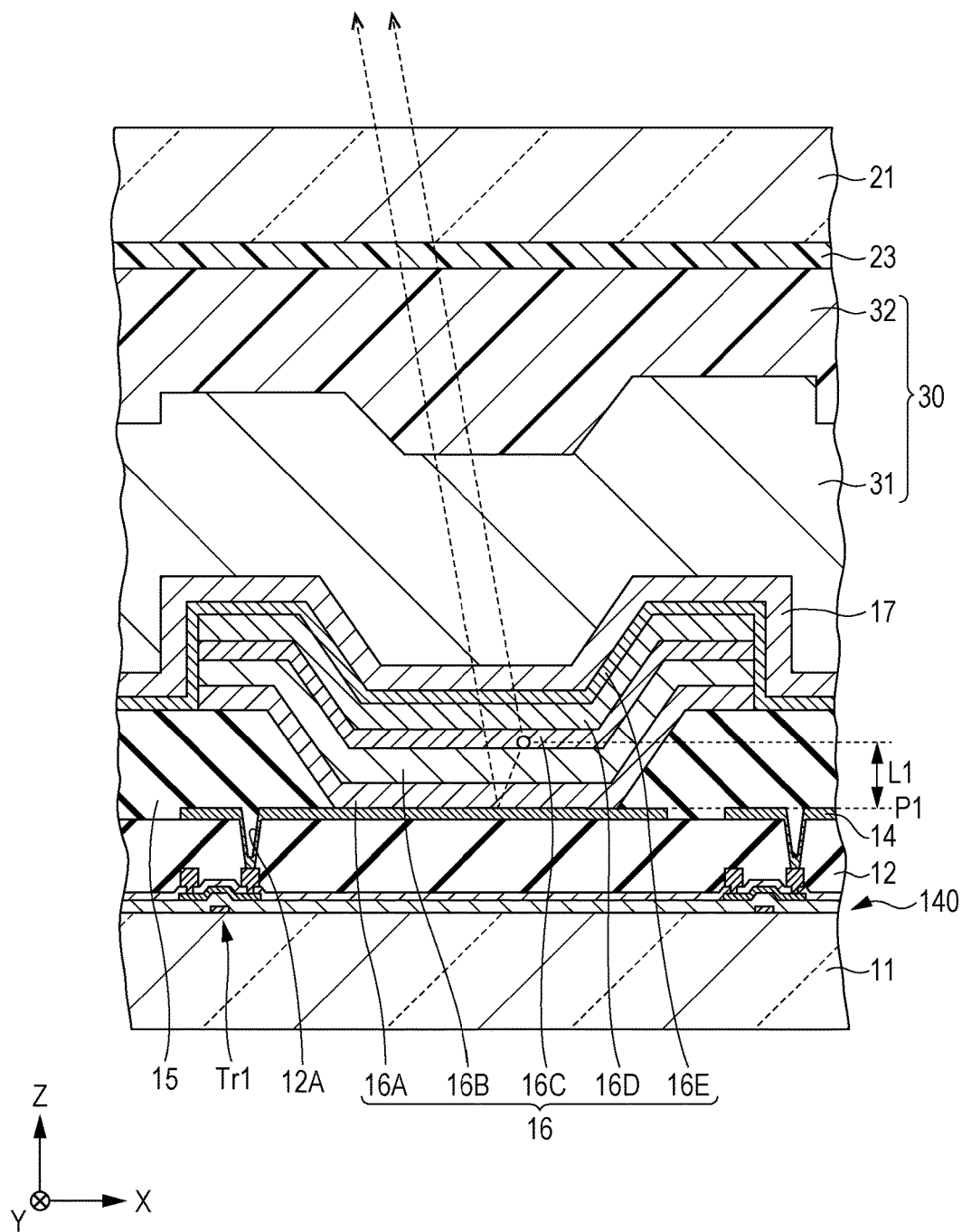
FIG. 9 is a sectional view illustrating another example of a sectional structure of a light emitting element of a pixel in the display device illustrated in FIG. 1.

The light emitting elements 10R, 10G, and 10B may be elements in which, as illustrated in FIG. 9, the semi-permeable reflection surface P2 is not included and the light generated at the light emitting layer 16C is reflected at the reflection surface P1, and is interfered with between the reflected light and the light generated at the light emitting layer 16C.

1.2 Specific Design Example

In the display device 1 in the present embodiment, by changing the size (width) in the lateral direction of the light shielding portion 24, the viewing angle characteristics in the direction in which the color separation is not performed can be adjusted. For example, by decreasing the width of the light shielding portion 24, the viewing angle characteristics in the vertical direction of the third sub-pixel 2B can become wide-angle, and it is possible to combine the viewing angle characteristics of the first sub-pixel 2R and the second sub-pixel 2G. It is possible to adjust the viewing angle characteristics in the lateral direction such that the widths of the first color filter 23R of the first sub-pixel 2R and the second color filter 23G of the second sub-pixel 2G, and the width of the third color filter 23B of the third sub-pixel 2B become different from each other.

Figure 10:
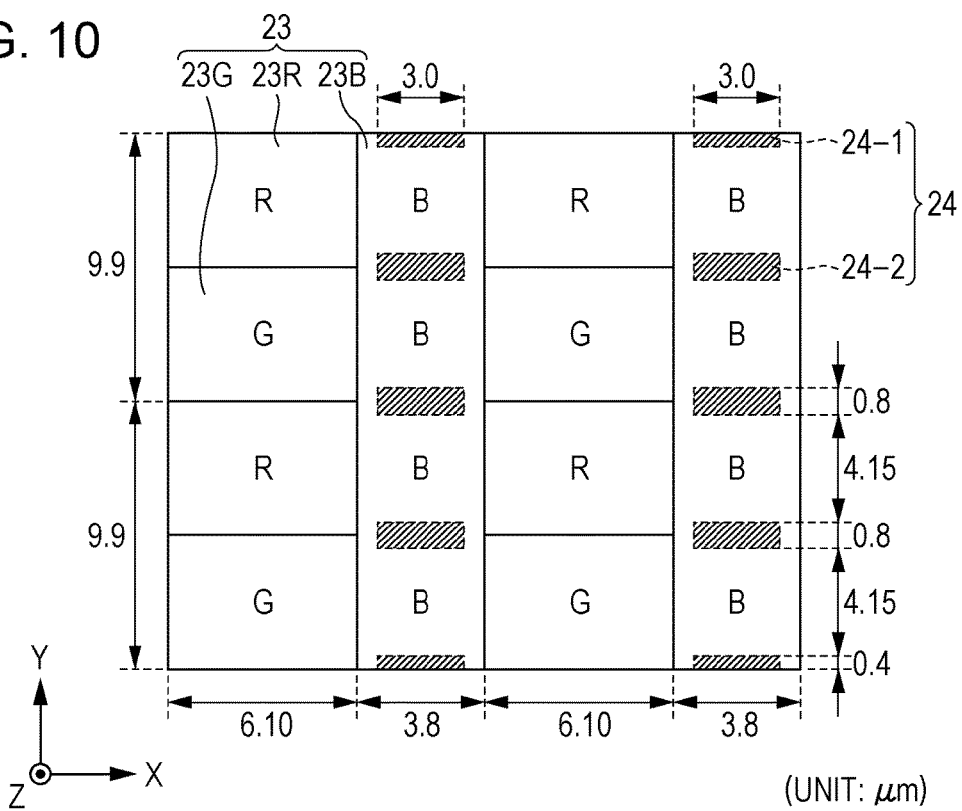
FIG. 10 is a plan view illustrating a design example of a pixel in the display device illustrated in FIG. 1.

FIG. 10 illustrates a design example of the pixel 2 in the present embodiment. The dimension of each portion is as follows.

pitch of one pixel: 9.9 μm
$L_{BM-H}$: 3.0 μm
$L_{BM-V}$: 0.8 μm
$L_{subpix1-H}$: 6.1 μm
$L_{subpix2-H}$: 6.1 μm
$L_{subpix3-H}$: 3.8 μm
$L_{subpix1-V}$ 4.95 μm
$L_{subpix2-V}$: 4.95 μm
$L_{subpix3-V}$: 4.15 μm For example, in a narrow pitch pixel in which a relationship between a gap $D_G$ (FIG. 5) between the light emitting elements 10R, 10G, and 10B and the color filter 23, and the opening width of the sub-pixel is 1:1, it is preferable that the opening width $L_{subpix1-H}$ of the first sub-pixel 2R in the lateral direction and the opening width $L_{subpix2-H}$ of the second sub-pixel 2G in the lateral direction respectively be one to three times the opening width $L_{subpix3-H}$ of third sub-pixel 2B in the lateral direction as described below.

$$1 < L_{subpix1-H}/L_{subpix3-H} < 3$$

$$1 < L_{subpix2-H}/L_{subpix3-H} < 3$$

The third sub-pixel 2B that emits the third color light LB of which the wavelength is short has a high light extraction efficiency in a low angle side (less than 20 degree) due to the interference in the cell of display panel compared to the first sub-pixel 2R and the second sub-pixel 2G that emit the light of which the wavelength is longer than that of the third color light LB, and thus, the viewing angle characteristics are not so good. In order to control the characteristics, by reducing the opening width of the third sub-pixel 2B in the lateral direction, the viewing angle characteristics of each of the first sub-pixel 2R, the second sub-pixel 2G, and the third sub-pixel 2B coincide with each other, and thus, the color variation is improved.

If the width $L_{BM-H}$ of the light shielding portion 24 in the lateral direction is decreased, the viewing angle of the third sub-pixel 2B in the vertical direction increases (the viewing angle the lateral direction is not affected). In the pixel structure in the present embodiment, since the opening width of $L_{subpix3-V}$ is less than that of $L_{subpix1-V}$ and $L_{subpix2-V}$, it is necessary to increase the viewing angle characteristics of the third sub-pixel 2B by decreasing the $L_{MB-H}$. If the value of $L_{BM-H}$ is as the value obtained from the Formula (3), the viewing angle characteristics of each sub-pixel in the vertical direction coincide with each other, and thus, the color variation is improved. In practical use, it is not necessary for the value to perfectly satisfy Formula (3), but may be a value that substantially satisfies Formula (3).

$$L_{BM-H} = L_{subpix3-H} \times L_{subpix3-V}/L_{subpix1-V}$$

$$L_{BM-H} = L_{subpix3-H} \times L_{subpix3-V}/L_{subpix2-V} \quad \text{Formula (3)}$$

Figure 11:
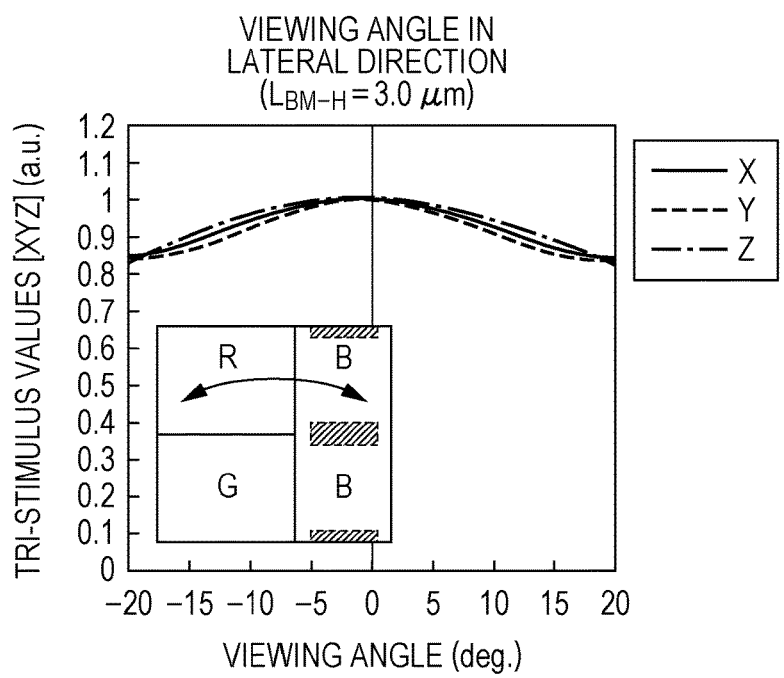
FIG. 11 is a characteristic diagram illustrating viewing angle characteristics of a pixel in a lateral direction in the design example illustrated in FIG. 10.
Figure 12:
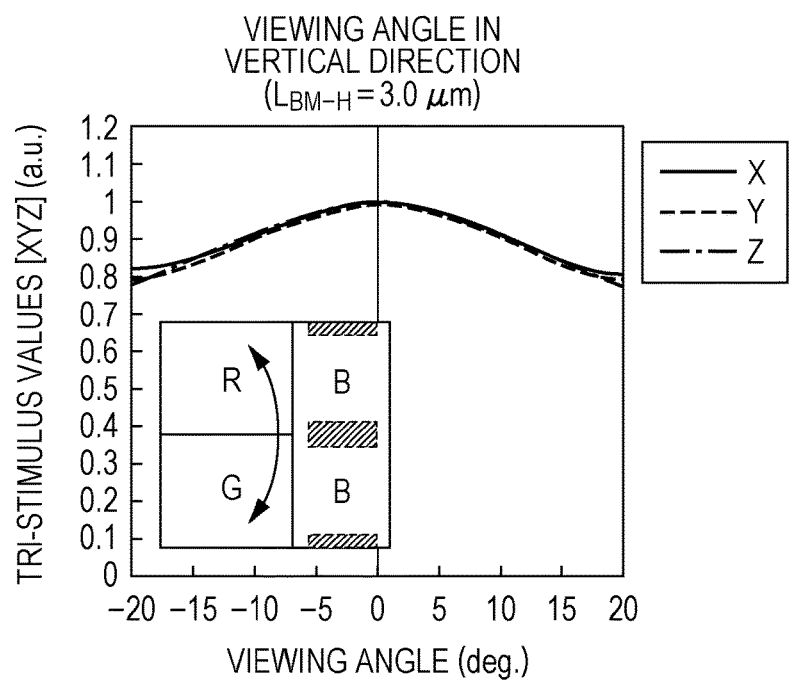
FIG. 12 is a characteristic diagram illustrating viewing angle characteristics of a pixel in a vertical direction in the design example illustrated in FIG. 10.

FIG. 11 illustrates the viewing angle characteristics of the pixel 2 in the lateral direction in the design example in FIG. 10. FIG. 12 illustrates the viewing angle characteristics of the pixel 2 in the vertical direction in the design example in FIG. 10. In FIG. 11 and FIG. 12, white color tri-stimulus values of X, Y, and Z are illustrated. The stimulus value X corresponds to the first color light LR emitted by the first sub-pixel 2R. The stimulus value Y corresponds to the second color light LG emitted by the second sub-pixel 2G. The stimulus value Z corresponds to the third color light LB emitted by the third sub-pixel 2B.

As in the design example illustrated in FIG. 10, by making the $L_{BM-V}$ be 0.8 µm, the tri-stimulus values X, Y, and Z in the viewing angle characteristics coincide with each other as illustrated in FIG. 12, and it can be seen that the color variation of the viewing angle characteristics decreases. In addition, in the viewing angle characteristics the lateral direction, by making the opening width of the third sub-pixel 2B smaller than that of the first sub-pixel 2R and the second sub-pixel 2G as illustrated in FIG. 11, the tri-stimulus values X, Y, and Z coincide with each other, the color variation of the viewing angle characteristics decreases.

Figure 13:
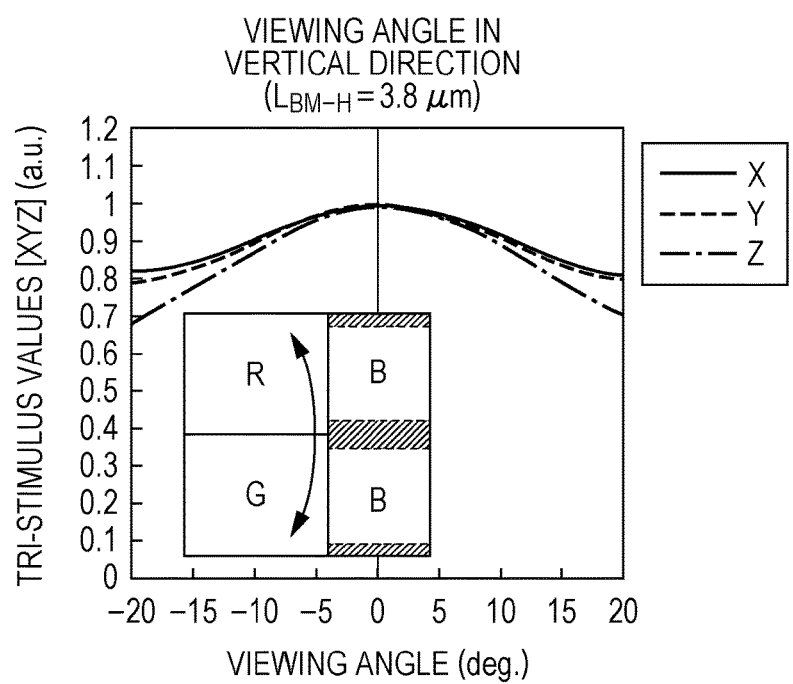
FIG. 13 is a characteristic diagram illustrating viewing angle characteristics of a pixel in a vertical direction in a case where a width of a light shielding portion is large in the design example illustrated in FIG. 10.
Figure 14:
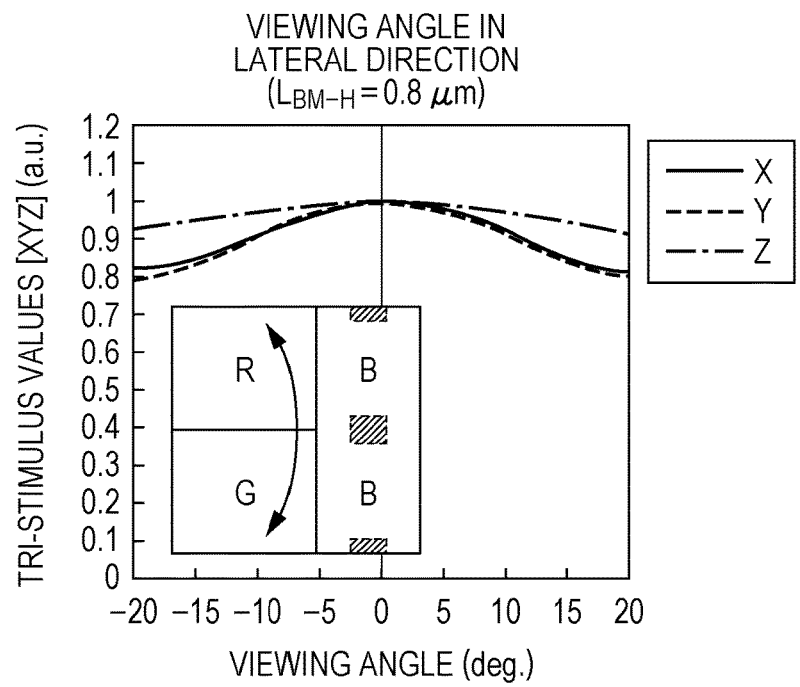
FIG. 14 is a characteristic diagram illustrating viewing angle characteristics of a pixel in a vertical direction in a case where a width of a light shielding portion is small in the design example illustrated in FIG. 10.

Next, the viewing angle characteristics of the pixel 2 in the vertical direction in a case where the width value $L_{BM-H}$ of the light shielding portion 24 is changed is illustrated in FIG. 13 and FIG. 14. FIG. 13 illustrates the viewing angle characteristics in a case where the width $L_{BM-H}$ of the light shielding portion 24 is large ($L_{BM-H}$=3.8 µm) in the design example illustrated in FIG. 10, and FIG. 14 illustrates the viewing angle characteristics in a case where the width $L_{BM-H}$ of the light shielding portion 24 is small ($L_{BM-H}$=0.8 µm) in the design example illustrated in FIG. 10.

In FIG. 13, it can be seen that the viewing angle characteristics of the third sub-pixel 2B (stimulus value Z) in the vertical direction become small by making the width $L_{BM-H}$ of the light shielding portion 24 large. In addition, from FIG. 14, it can be seen that the viewing angle characteristics of the third sub-pixel 2B (stimulus value Z) in the vertical direction becomes wide by making the width $L_{BM-H}$ of the light shielding portion 24 be small. In this way, since the pixel width that limits the viewing angle is changed by changing the width $L_{BM-H}$ of the light shielding portion 24, it is possible to adjust the viewing angle characteristics. By adjusting the width $L_{BM-H}$ of the light shielding portion 24 as a design parameter, it can be possible to set an optimal design value according to the pixel pitch (opening width) or the value of the gap $D_G$ between the light emitting elements 10R, 10G, and 10B, and the color filter 23.

1.3 Effects

As described above, according to the present embodiment, the viewing angle of the third sub-pixel 2B in the first direction (Y direction) is limited by the light shielding portion 24. Therefore, it is possible to achieve both the wide opening and the wide viewing angle.

Figure 15:
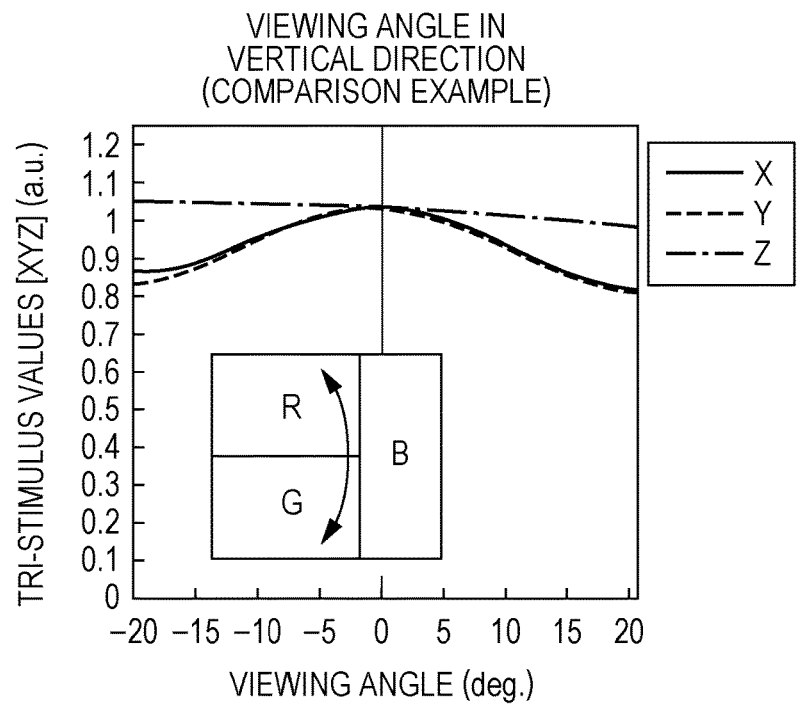
FIG. 15 is a characteristic diagram illustrating viewing angle characteristics of a pixel in a vertical direction in a case where the light shielding portion is not provided, as a comparison example to the design example illustrated in FIG. 10.

FIG. 15 illustrates the viewing angle characteristics of the pixel 2 in the vertical direction in a case where the light shielding portion 24 is not provided ($L_{BM\_H}$ and $L_{BM\_V}$=0) as a comparison example with respect to the design example illustrated in FIG. 10. In the structure of the comparison example, since there is no light shielding portion 24, the opening width of the third sub-pixel 2B in the vertical direction increases. For this reason, in the viewing angle characteristics in the vertical direction, in an image viewed with an angle with respect to the display surface at the time of white color display, the stimulus value Z of the third sub-pixel 2B relatively increases, and the color variation in blue color occurs. On the other hand, in the array structure of the pixel 2 in the present embodiment, since the light shielding portion 24 is provided in the third sub-pixel 2B, the viewing angle characteristics (stimulus value Z) of the third sub-pixel 2B can be controlled, and the color variation can be decreased. In addition, in the viewing angle characteristics in the lateral direction, by making the opening width of the third sub-pixel 2B of which the wavelength is short in the lateral direction be less than that of other sub-pixel, the viewing angle characteristics of each pixel in the lateral direction can coincide with each other, and then, the color variation can be improved. In this way, it is possible to achieve both the wide opening (long life time) and the wide viewing angle while retaining excellent visibility.

The effects described herein are just examples and are not limited thereto, and there may be other effects. The same applies to other embodiments and modification examples described below.

1.4 MODIFICATION EXAMPLES 1.4.1 First Modification Example

Figure 16:
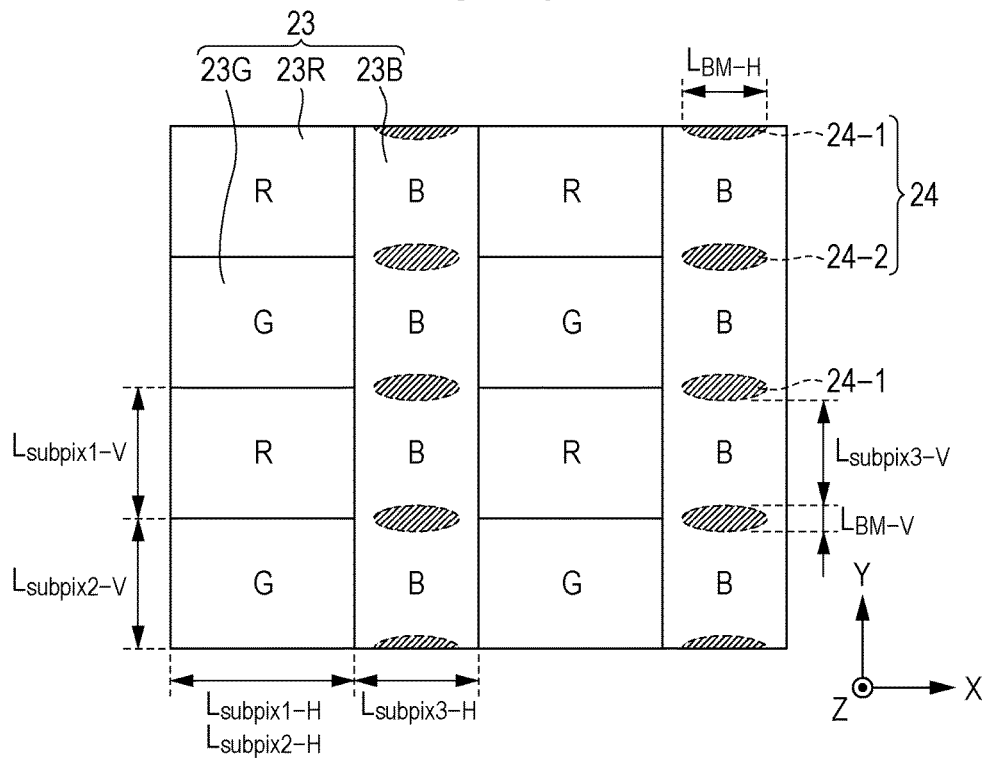
FIG. 16 is a plan view illustrating an example of an array structure of a color filter portion of a pixel in a display device in a first modification example of the first embodiment.

FIG. 16 illustrates an example of an array structure of a color filter portion of the pixel 2 in a first modification example. As illustrated in FIG. 16, the planar shape of the light shielding portion 24 may be a substantially elliptical shape.

1.4.2 Second Modification Example

Figure 17:
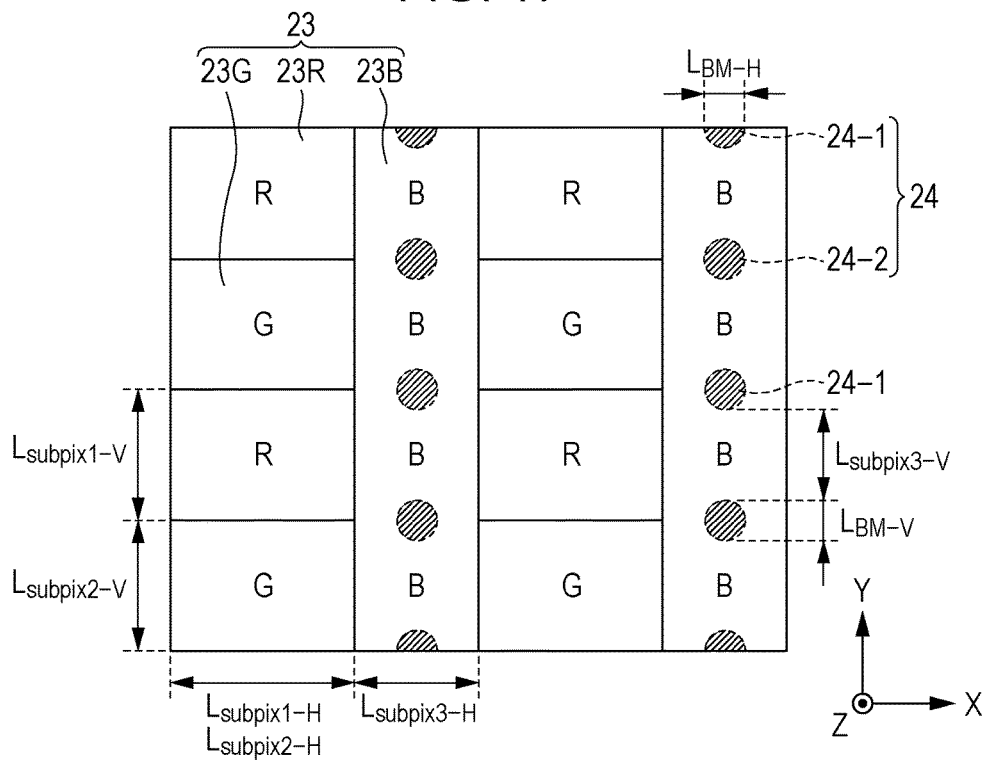
FIG. 17 is a plan view illustrating an example of an array structure of a color filter portion of a pixel in a display device in a second modification example.

FIG. 17 illustrates an example of an array structure of a color filter portion of the pixel 2 in a second modification example. As illustrated in FIG. 17, the planar shape of the light shielding portion 24 may be a substantially circular shape.

The planar shape of the light shielding portion 24 is not limited to the rectangular shape, the elliptical shape, or the circular shape, but any other arbitrary planar shape can be employed.

1.4.3 Third Modification Example

Figure 18:
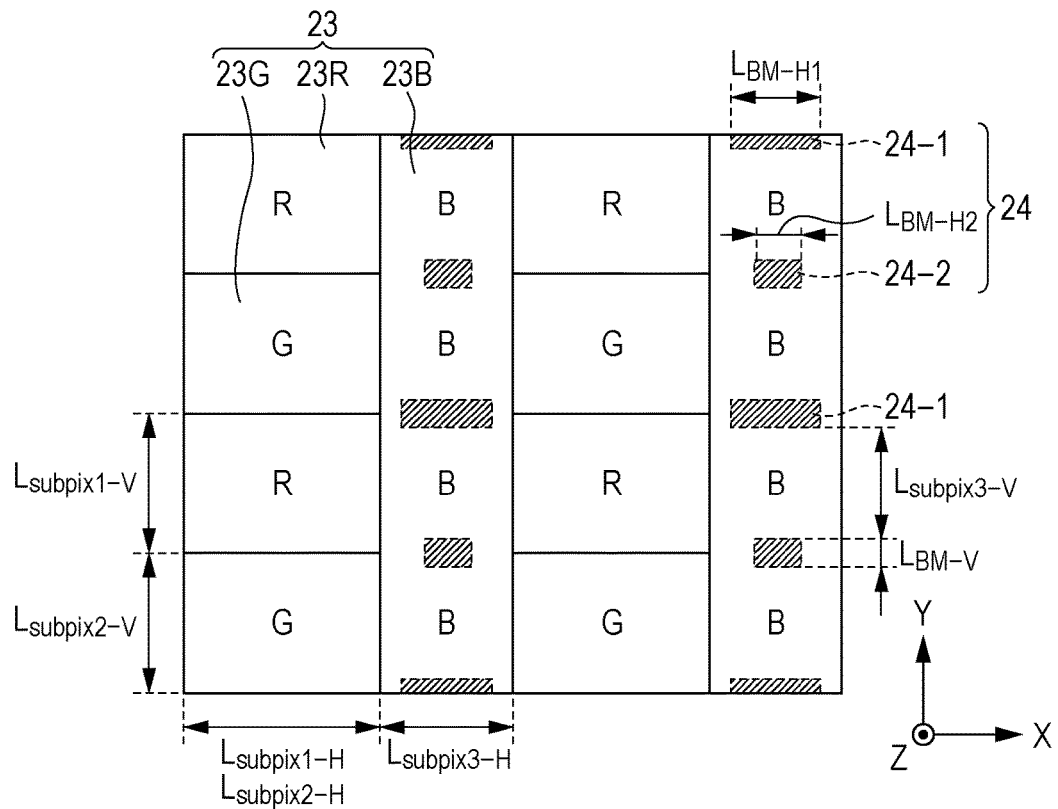
FIG. 18 is a plan view illustrating an example of an array structure of a color filter portion of a pixel in a display device in a third modification example.
Figure 19:
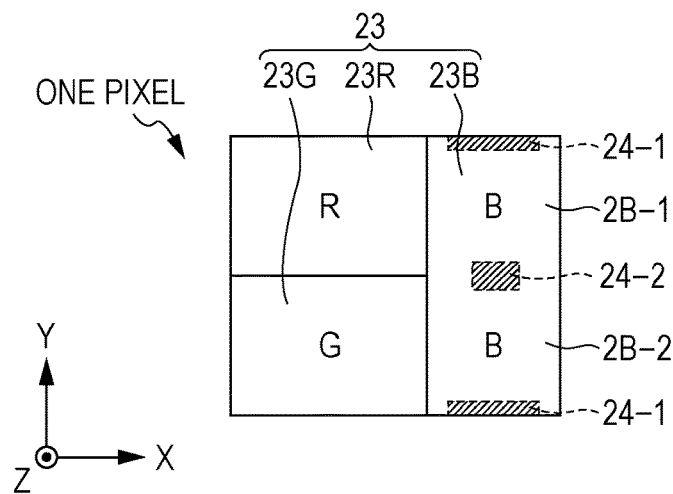
FIG. 19 is a plan view illustrating an example of a configuration of a color filter portion for one pixel in the display device illustrated in FIG. 18.

FIG. 18 illustrates an example of an array structure of a color filter portion of the pixel 2 in a third modification example. FIG. 19 illustrates an example of a configuration of a color filter portion for one pixel. As illustrated in FIG. 18 and FIG. 19, a width $L_{BM-H1}$ of the first light shielding part 24-1 of the light shielding portion 24 in the lateral direction and a width $L_{BM-H2}$ of the second light shielding part 24-2 in the lateral direction may be different from each other.

1.4.4 Fourth Modification Example

Figure 20:
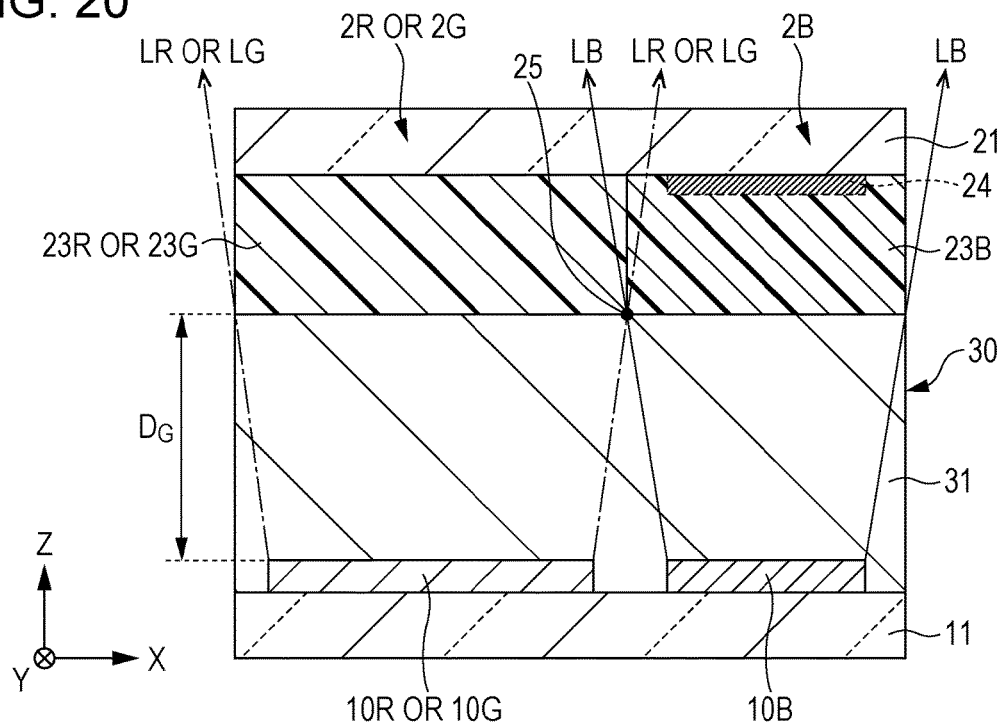
FIG. 20 is a sectional view illustrating an example of a sectional structure of a pixel in a display device in a fourth modification example.

FIG. 20 illustrates an example of an array structure of a color filter portion of the pixel 2 in a fourth modification example. As illustrated in FIG. 20, with respect to the sectional structure illustrated in FIG. 5, the resin layer 32 may be omitted from the intermediate layer 30.

1.4.5 Fifth Modification Example

Figure 21:
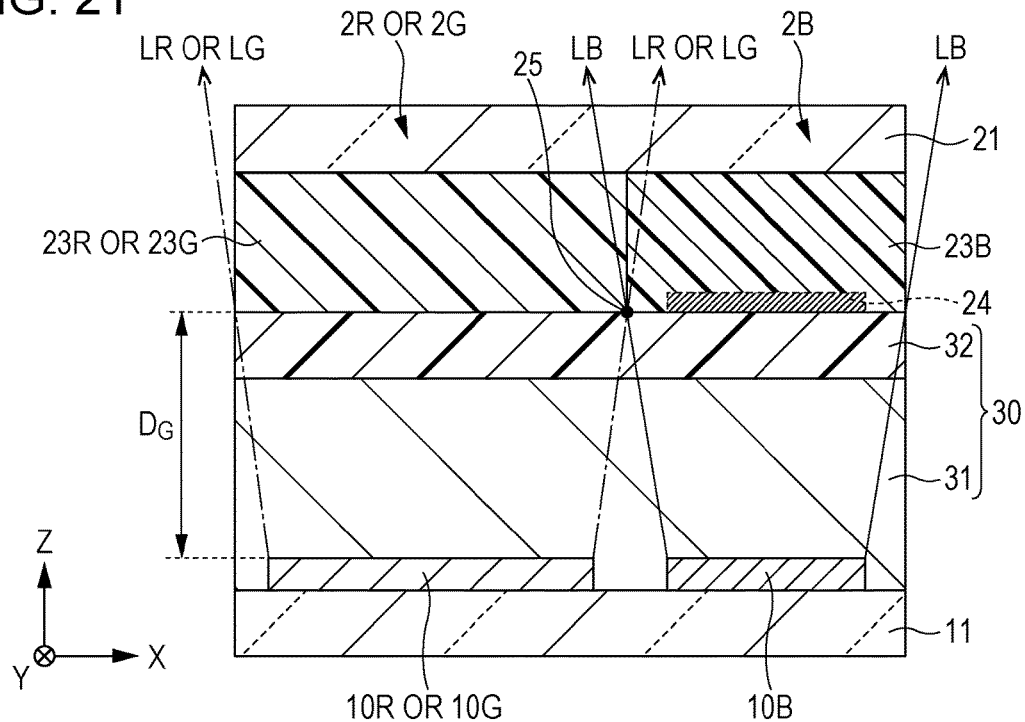
FIG. 21 is a sectional view illustrating an example of a sectional structure of a pixel in a display device in a fifth modification example.

FIG. 21 illustrates an example of an array structure of a color filter portion of the pixel 2 in a fifth modification example. As illustrated in FIG. 21, with respect to the sectional structure illustrated in FIG. 5, the position on which the light shielding portion 24 is provided in a thickness direction (Z direction) may be different. In the sectional structure illustrated in FIG. 5, the light shielding portion 24 is provided on side opposite to the intermediate layer 30. However, as illustrated in FIG. 21, the light shielding portion 24 may be provided on a side near the intermediate layer 30.

2. Second Embodiment (An Example in which the Light Shielding Portion 24 is Disposed in a Position Other than a Center Portion in One Pixel)

2.1 Configuration

In the present embodiment, an array structure of the pixel 2, particularly a position on which the light shielding portion 24 is disposed, is different from that in the display device 1 in the first embodiment described above.

In the present embodiment, the configuration and the action relating to the portions other than the array structure of the pixel 2, particularly, the position on which the light shielding portion 24, may be similar to those in the first embodiment. In addition, the configuration may be adopted in which the modification examples in the present embodiment and the first embodiment are combined.

Figure 22:
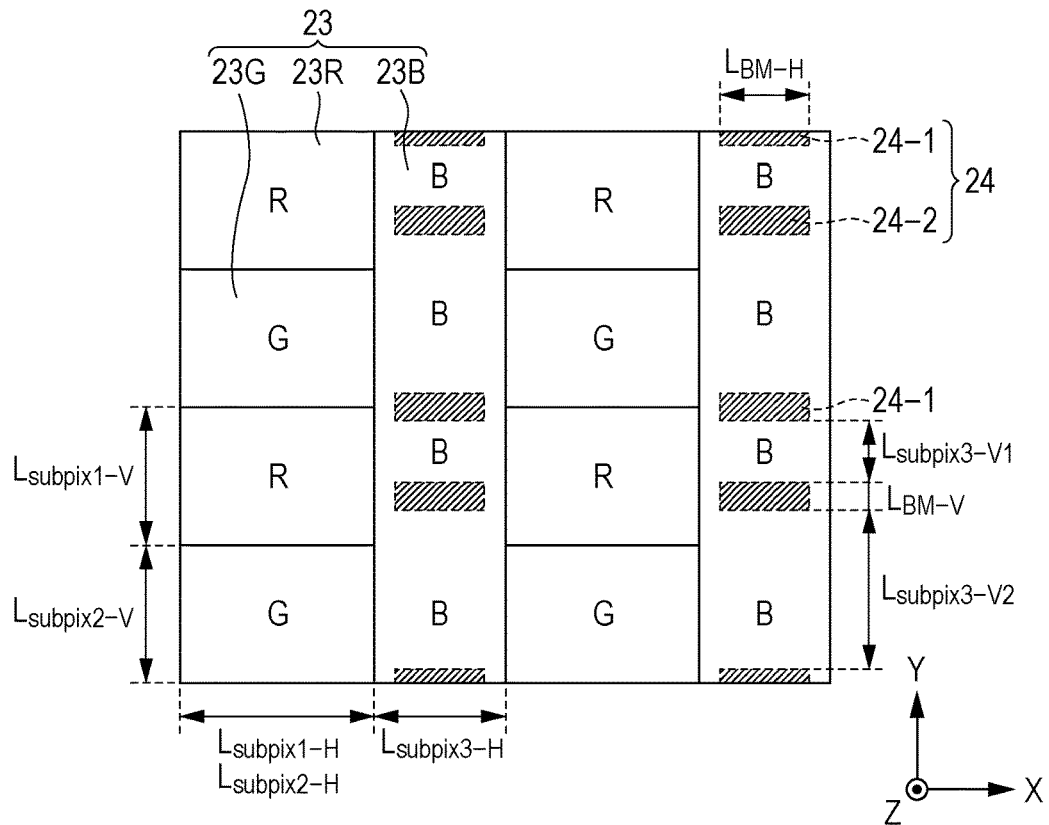
FIG. 22 is a plan view illustrating an example of an array structure of a color filter portion of a pixel in a display device in a second embodiment.
Figure 23:
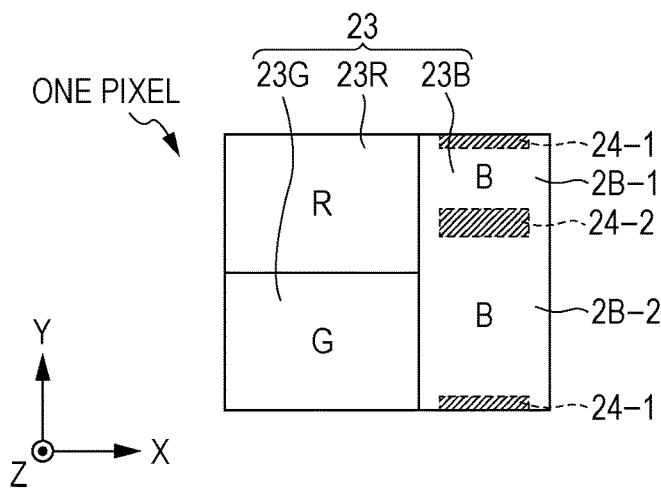
FIG. 23 is a plan view illustrating an example of a configuration of a color filter portion for one pixel in the display device illustrated in FIG. 22.
Figure 24:
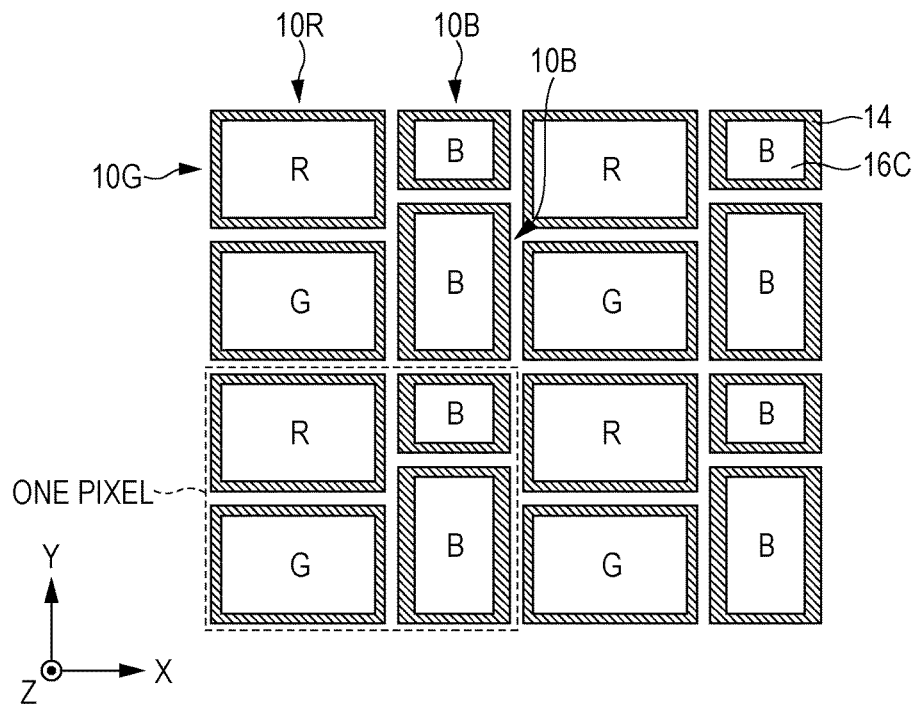
FIG. 24 is a plan view illustrating an example of an array structure of a light emitting element in the display device illustrated in FIG. 22.

FIG. 22 illustrates an example of an array structure of a color filter portion of the pixel 2 in the present embodiment. FIG. 23 illustrates an example of a configuration of a color filter portion for one pixel in the present embodiment. FIG. 24 illustrates an example of an array structure of a light emitting element of the pixel 2.

In the array structure of the pixel 2 in the present embodiment, the second light shielding part 24-2 of the light shielding portion 24 is provided on a position different from the center portion in the third sub-pixel 2B in the first direction. For this reason, in one pixel, the sizes (sizes of the openings) of the first pixel area 2B-1 and the second pixel area 2B-2 in the third sub-pixel 2B are different from each other, with the second light shielding part 24-2 as the boundary. In this way, the viewing angle characteristics of the first pixel area 2B-1 and the viewing angle characteristics of the second pixel area 2B-2 are different each other. In FIG. 22, $L_{subpix3-V1}$ indicates the opening width of the first pixel area 2B-1 in the vertical direction. $L_{subpix3-V2}$ indicates the opening width of the second pixel area 2B-2 in the vertical direction.

In the present embodiment, it is preferable that the planar shapes of the first light emitting element 10R, the second light emitting element 10G, and the third light emitting element 10B be the shapes according to the position on which the color filter 23 and the light shielding portion 24 are disposed as illustrated in FIG. 24. It is preferable that, in one pixel, the third light emitting element 10B be separated at the portion corresponding to the position on which the second light shielding part 24-2 is provided. In the second direction, the width of the third light emitting element 10B and the width of the light shielding portion 24 may be different from each other. The first light emitting element 10R, the second light emitting element 10G, and the third light emitting element 10B may respectively include the light emitting layer 16C (light emitting surface) and the lower electrode 14 (reflection surface).

2.2 Acts and Effects

Figure 25:
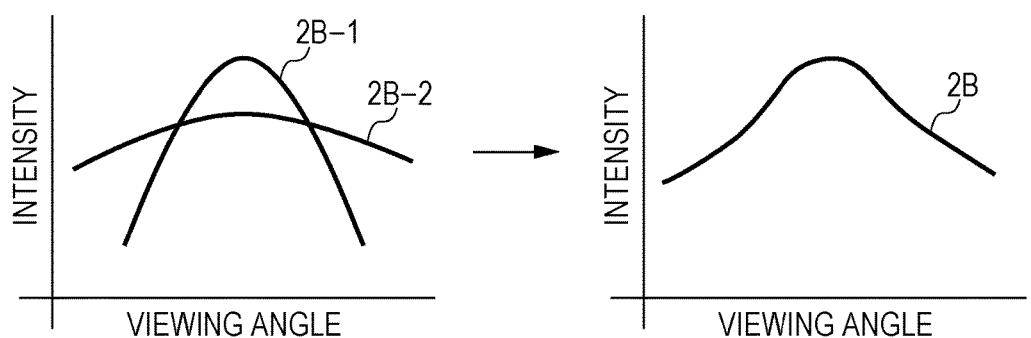
FIG. 25 is an explanatory diagram illustrating viewing angle characteristics of a third sub-pixel in a vertical direction in the display device illustrated in FIG. 22.

FIG. 25 illustrates viewing angle characteristics of the third sub-pixel 2B in the vertical direction in the present embodiment. In the left diagram of FIG. 25, the viewing angle characteristics of each of the first pixel area 2B-1 and the second pixel area 2B-2 in the third sub-pixel 2B are independently illustrated. In the left diagram of FIG. 25, the viewing angle characteristics of the entire third sub-pixel 2B are illustrated.

The viewing angle characteristics can be adjusted by shifting the position of the light shielding portion 24 from the center portion of one pixel and changing the opening width of the third sub-pixel 2B in the vertical direction in one pixel. Since the viewing angle characteristics of the entire third sub-pixel 2B is the sum of the viewing angle characteristics of the vertically wide pixel (the second pixel area 2B-2) and the viewing angle characteristics of the narrow pixel (the first pixel area 2B-1), an inflection point can be provided on the entire viewing angle characteristics as illustrated in the right diagram in FIG. 25, and it is possible to finely adjust the viewing angle characteristics.

3. Third Embodiment (An Example of a 4-Color Type Display Device 1A)

Figure 26:
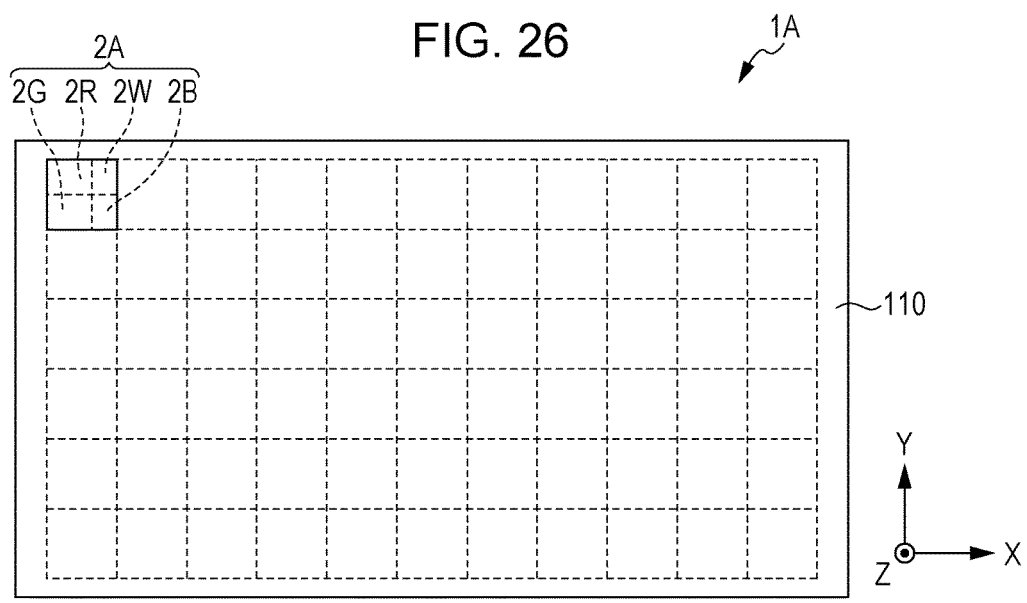
FIG. 26 is a plan view illustrating an example of a display device in a third embodiment.

FIG. 26 is a diagram illustrating an example of a planar configuration of the display device 1A in the present embodiment. The display device 1A in the present embodiment has a configuration in which a plurality of pixels 2A having a 4-color sub-pixel in which a fourth sub-pixels 2W is added to the first sub-pixel 2R, the second sub-pixel 2G, and the third sub-pixel 2B, is disposed in matrix shape in the first direction and the second direction.

In the present embodiment, the configuration other than the portions relating to the array structure, the action, and the effects of the pixel 2A may be similar to those in the first embodiment.

In the display device 1A in the present embodiment, the fourth sub-pixel 2W is disposed to be adjacent to the first sub-pixel 2R in the second direction (X direction). The third sub-pixel 2B is disposed to be adjacent to the second sub-pixel 2G in the second direction (X direction) and adjacent to the fourth sub-pixel 2W in the first direction (Y direction).

Not being limited to the illustrated example of disposing the sub-pixels, for example, the fourth sub-pixel 2W and the third sub-pixel 2B may be disposed in reverse. That is, the third sub-pixel 2B may be disposed to be adjacent to the first sub-pixel 2R in the second direction (X direction), and the fourth sub-pixel 2W may be disposed to be adjacent to the second sub-pixel 2G in the second direction (X direction).

Hereinafter, a first example and a second example of the array structure of the pixel 2A will be described with reference to FIG. 27 to FIG. 29 and FIG. 30 to FIG. 32. Each pixel 2A includes the light emitting element that emits a color light and the color filter 23A that transmits a color light. The fourth sub-pixel 2W includes a fourth light emitting element that emits a fourth a color light and a fourth color filter 23W that transmits the fourth color light from the fourth light emitting element. The fourth light emitting element of the fourth sub-pixel 2W is an element that emits, for example, a white color light.

3.1 First Example of an Array Structure of the Pixel 2A

Figure 27:
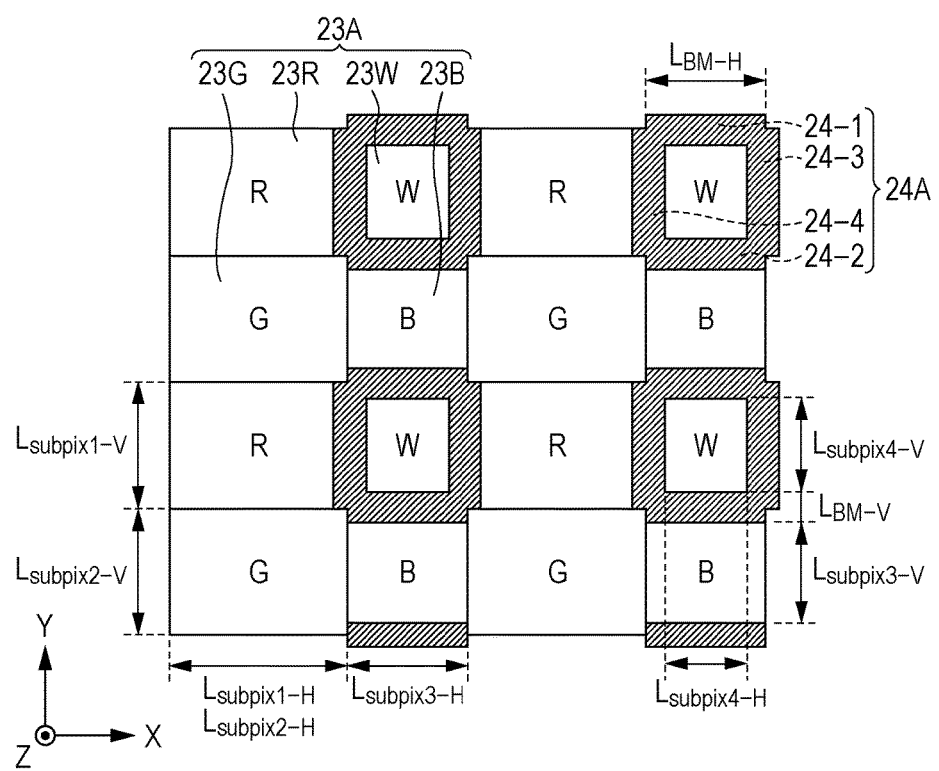
FIG. 27 is a plan view illustrating a first example of an array structure of a color filter portion of a pixel in the display device in FIG. 26.
Figure 28:
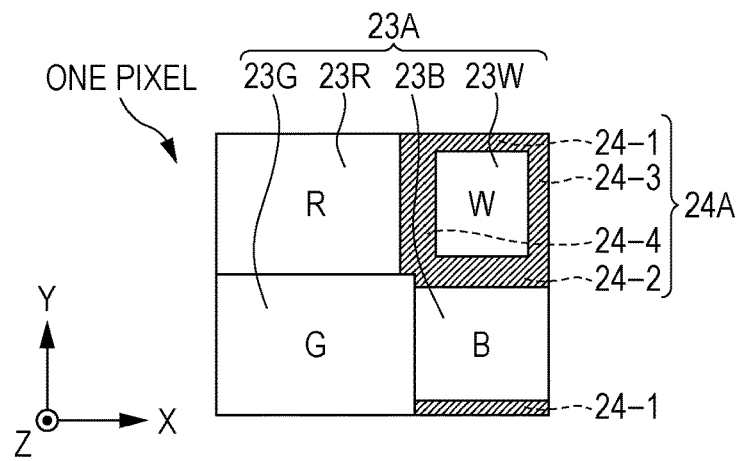
FIG. 28 is a plan view illustrating an example of a configuration of a color filter portion for one pixel in the first example in FIG. 27.
Figure 29:
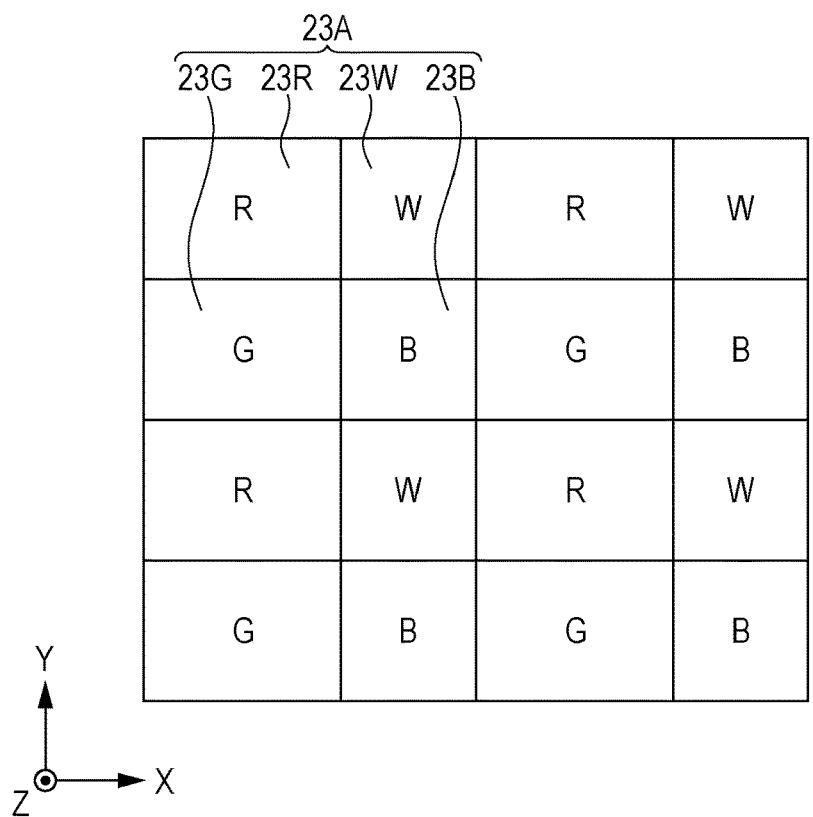
FIG. 29 is a plan view illustrating an example of an array structure of only a color filter in which the light shielding portion is not provided in the first example in FIG. 27.

FIG. 27 illustrates the first example of the array structure of the color filter portion of the pixel 2A. FIG. 28 illustrates an example of a configuration of the color filter portion for one pixel in the first example illustrated in FIG. 27. FIG. 29 illustrates an example of an array structure of only the color filter 23A in which the light shielding portion 24A is omitted in the first example illustrated in FIG. 27.

The light shielding portion 24A is disposed around the fourth sub-pixel 2W so as to include the boundary portion of the first sub-pixel 2R and the third sub-pixel 2B. The light shielding portion 24A limits the viewing angle of the third sub-pixel 2B in the first direction and limits the viewing angle of the fourth sub-pixel 2W in the first direction and the second direction.

The light shielding portion 24A is formed of the first light shielding part 24-1, the second light shielding part 24-2, the third light shielding part 24-3, and the fourth light shielding part 24-4. The first light shielding part 24-1 is provided on the boundary portion of the pixels adjacent to each other in the first direction. The second light shielding part 24-2 is provided on the boundary portion of the third sub-pixel 2B and the fourth sub-pixel 2W in one pixel. The third light shielding part 24-3 is provided on the boundary portion of the pixels adjacent to each other in the second direction. The fourth light shielding part 24-4 is provided on the boundary portion of the first sub-pixel 2R and the fourth sub-pixel 2W in one pixel.

In FIG. 27, $L_{subpix4\text{-}H}$ indicates the opening width of the fourth sub-pixel 2W in the lateral direction and $L_{subpix4\text{-}V}$ indicates the opening width of the fourth sub-pixel 2W in the vertical direction.

As illustrated in FIG. 29, the first color filter 23R and the second color filter 23G have substantially the same sizes. In addition, the third sub-pixel 2B and the fourth color filter 23W have substantially the same sizes. It is preferable that the width of the third color filter 23B and the fourth color filter 23W in the lateral direction be less than the width of the first color filter 23R and the second color filter 23G in the lateral direction.

3.2 Second Example of an Array Structure of the Pixel 2A

Figure 30:
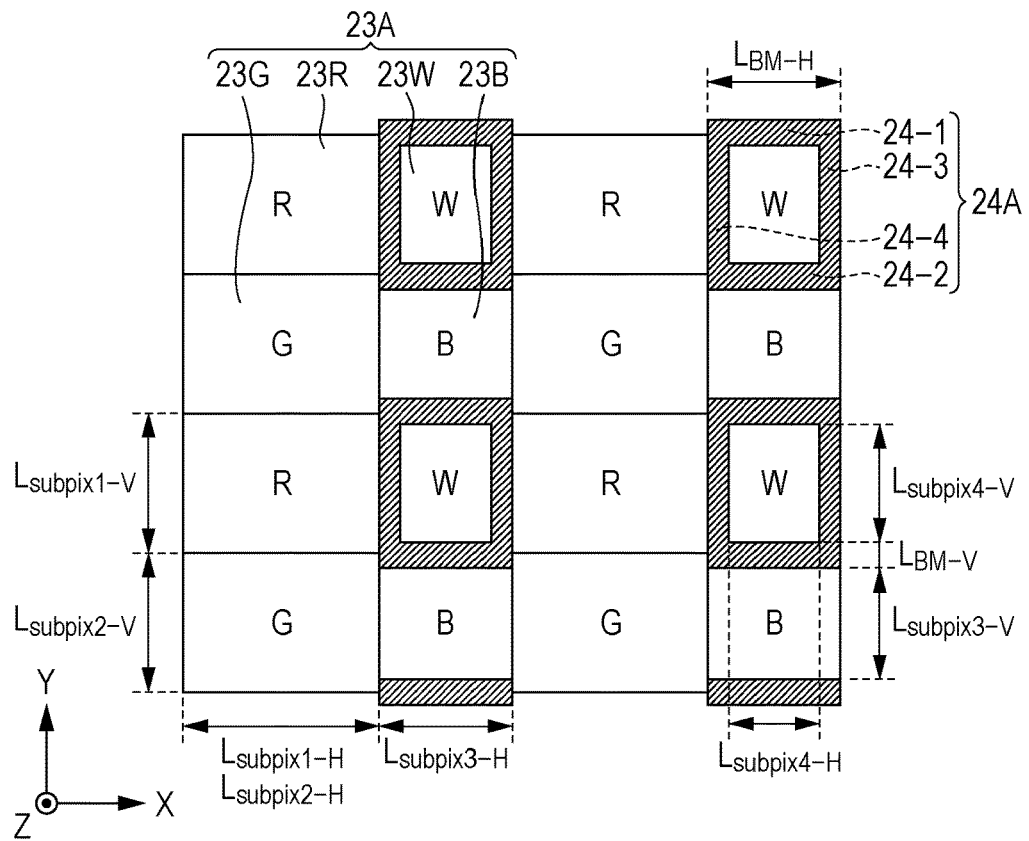
FIG. 30 is a plan view illustrating a second example of an array structure of a color filter portion of a pixel in the display device in FIG. 26.
Figure 31:
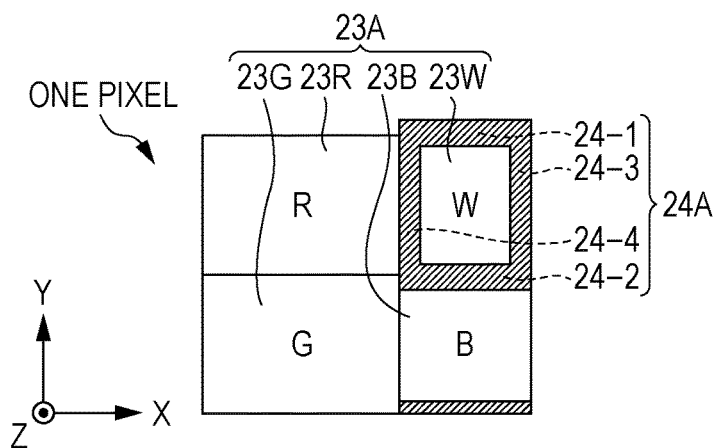
FIG. 31 is a plan view illustrating an example of a configuration of a color filter portion for one pixel in the second example in FIG. 30.
Figure 32:
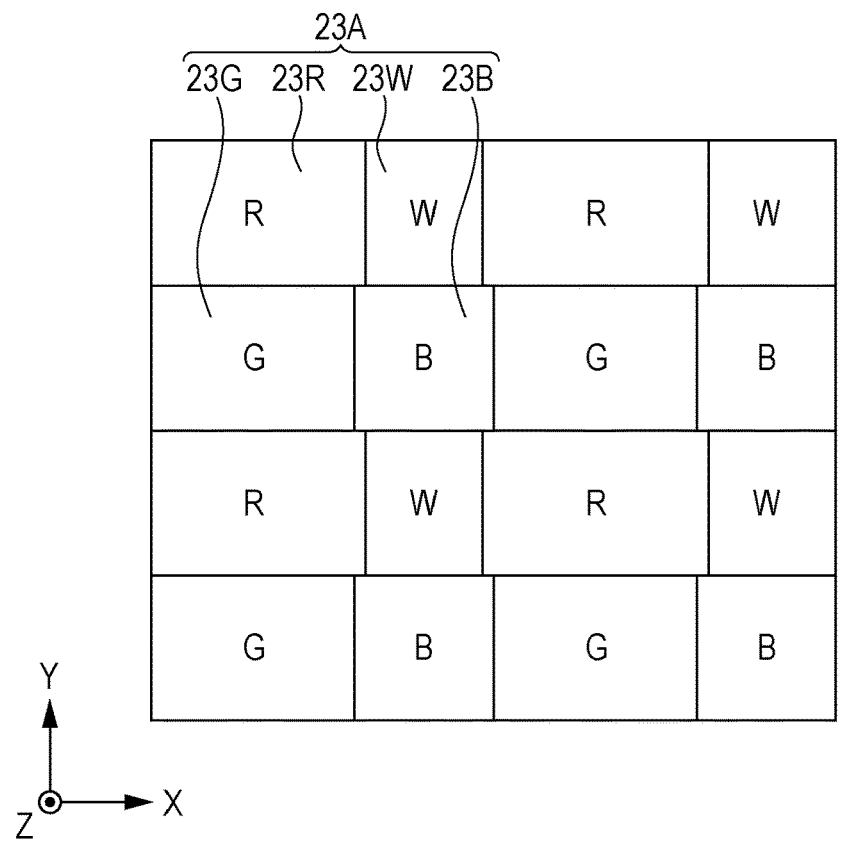
FIG. 32 is a plan view illustrating an example of an array structure of only a color filter in which the light shielding portion is not provided in the second example in FIG. 30.

FIG. 30 illustrates a second example of an array structure of a color filter portion of the pixel 2A. FIG. 31 illustrates an example of a configuration of the color filter portion for one pixel in the second example illustrated in FIG. 30. FIG. 32 illustrates an example of an array structure of only the color filter 23A in which the light shielding portion 24A is omitted in the second example illustrated in FIG. 30.

In the second example also, similarly to the first example described above, the light shielding portion 24A is disposed around the fourth sub-pixel 2W so as to include the boundary portion of the first sub-pixel 2R and the third sub-pixel 2B. The light shielding portion 24A, similarly to the first example, is formed of the first light shielding part 24-1, the second light shielding part 24-2, the third light shielding part 24-3, and the fourth light shielding part 24-4.

In FIG. 30, $L_{subpix4\text{-}H}$ indicates the opening width of the fourth sub-pixel 2W in the lateral direction and $L_{subpix4\text{-}V}$ indicates the opening width of the fourth sub-pixel 2W in the vertical direction.

In the second example, as illustrated in FIG. 32, the sizes of the first color filter 23R, the second color filter 23G, the third color filter 23B, and the fourth color filter 23W are different each other. It is preferable that the width of the third color filter 23B and the fourth color filter 23W in the lateral direction be less than the width of the first color filter 23R and the second color filter 23G in the lateral direction.

4. Application Example of a Display Device to an Electric Apparatus

The display device 1 and 1A in each embodiment described above can be mounted on electric apparatuses in various fields that perform the displaying of an image (or video).

4.1 First Application Example

Figure 33:
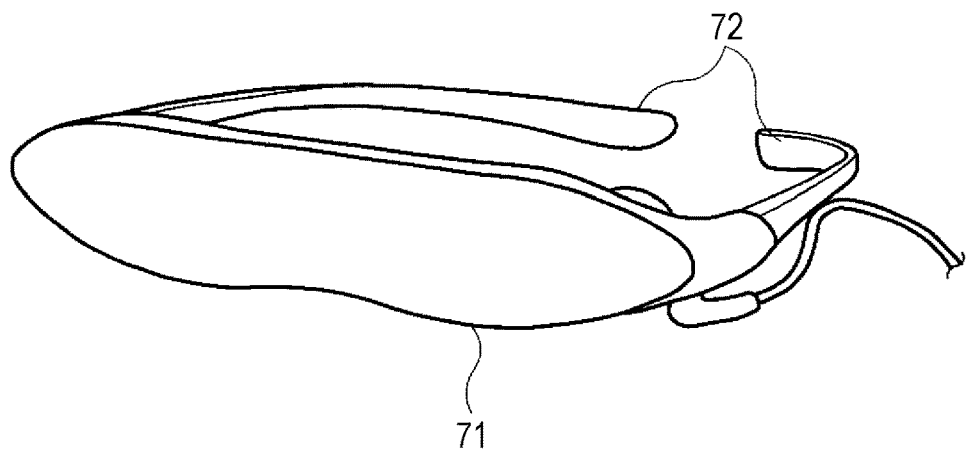
FIG. 33 is an external view illustrating a configuration example of a head mount display as a first application example of a display device to an electronic apparatus.

FIG. 33 is a diagram illustrating an external view of a head mount display on which the display device 1 or 1A is applied. The head mount display, for example, has an ear hook portion 72 for mounting on the user's head on both sides of a glass-shaped display portion 71, and the display portion 71 is configured from the display device 1 or 1A in each embodiment described above. By applying the display device 1 or 1A according to the present disclosure to the display portion 71 of the head mount display, both the wide opening and the wide viewing angle can be achieved, and thus, it is possible to contribute to the merchantability improvement of the head mount display.

4.2 Second Application Example

Figure 34:
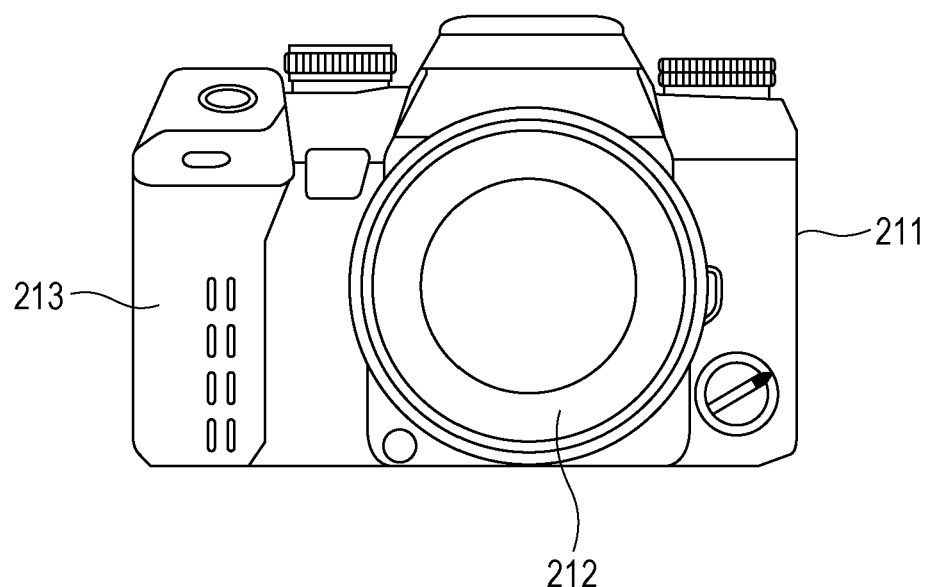
FIG. 34 is a front side external view illustrating a configuration example of a camera as a second application example of a display device to an electronic apparatus.
Figure 35:
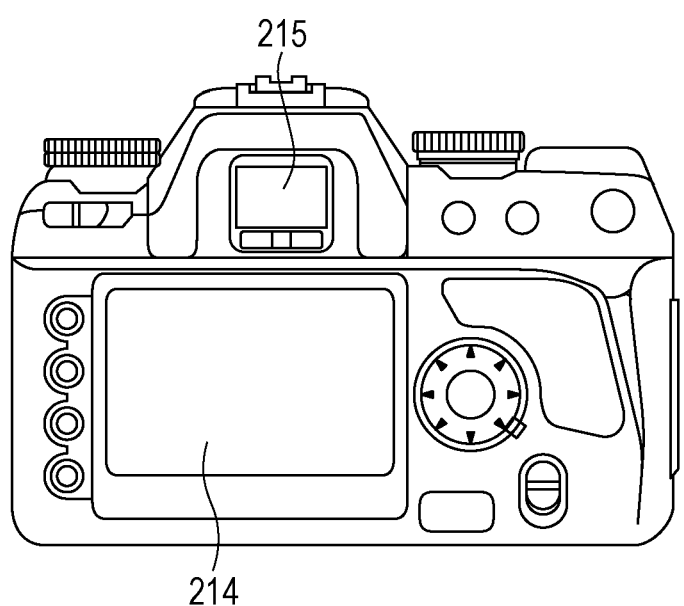
FIG. 35 is a rear side external view illustrating a configuration example of the camera as the second application example of the display device to an electronic apparatus.

FIG. 34 and FIG. 35 are diagrams illustrating the external view of an imaging apparatus (a lens-exchange style and single lens reflex type digital camera) to which the display device 1 or 1A is applied. The imaging apparatus, as illustrated in FIG. 34, has an exchangeable imaging lens unit (exchangeable lens) 212 on the front right side of a camera main body portion (camera body) 211, and has a grip portion 213 on the front left side of the camera body for the user to grip. As illustrated in FIG. 35, a monitor 214 is provided on the substantially center of the rear surface of the camera main body portion 211. As illustrated in FIG. 35, a view finder (an eyepiece window) 215 is provided on the upper portion of the monitor 214. A photographer can determine a frame by visually recognizing an optical image of a subject induced from the imaging lens unit 212 by looking into the view finder 215. The view finder 215 is configured from the display device 1 or 1A in each embodiment described above. By applying the display device 1 or 1A according to the present disclosure to the view finder of the imaging apparatus, both the wide opening and the wide viewing angle can be achieved, and thus, it is possible to contribute to the merchantability improvement of the head mount display.

The technology according to the present disclosure makes large contributions to particularly the electronic apparatus in the above-described application example. However, the technology according to the present disclosure can be applied to various electric apparatuses, not limited to the above-described application examples.

5. Other Embodiments

The technology according to the present disclosure is not limited to the descriptions in each of embodiments, and various modifications can be made.

For example, in each of the embodiments described above, the array structure of the pixels is described with the first direction as the vertical direction (Y direction) in the display plane, and the second direction as the lateral direction (X direction) in the display plane. However, the array structure of the pixels may be with the first direction as the lateral direction (X direction) and the second direction as the vertical direction (Y direction).

For example, the array structure of the pixel 2 of the display device 1 in the first embodiment illustrated in FIG. 1 and FIG. 2 may have the array structure of the display device 1B illustrated in FIG. 36 and FIG. 37. That is, as in the display device 1B illustrated in FIG. 36 and FIG. 37, the array structure may be a structure in which the first sub-pixel 2R and the second sub-pixel 2G are disposed to be adjacent to each other in the lateral direction (X direction), and the third sub-pixel 2B is disposed to be adjacent to both the first sub-pixel 2R and the second sub-pixel 2G in the vertical direction (Y direction).

In addition, the present technology can have a configuration as follows.

(1) A display device including: a plurality of pixels that is arrayed in a first direction and a second direction, in which each pixel includes: a first sub-pixel, a second sub-pixel that is disposed to be adjacent to the first sub-pixel in the first direction, a third sub-pixel that is disposed to be adjacent to at least one of the first sub-pixel and the second sub-pixel in the second direction, and a light shielding portion that is disposed corresponding to the position on which the third sub-pixel is disposed, so as to limit a viewing angle of the third sub-pixel in the first direction.

(2) The display device according to above (1), in which the third sub-pixel is disposed to be adjacent to both the first sub-pixel and the second sub-pixel in the second direction, and the light shielding portion includes a first portion that is provided on a boundary portion of the adjacent pixels in the first direction and a second portion that is provided within the third sub-pixel in one pixel.

(3) The display device according above (2), in which a width of the light shielding portion in the second direction is less than an opening width of the third sub-pixel.

(4) The display device according to above (2) or (3), in which the first sub-pixel includes a first color filter that transmits a first color light, the second sub-pixel includes a second color filter that transmits a second color light, the third sub-pixel includes a third color filter that transmits a third color light, a color separation is mutually performed on the first sub-pixel and the second sub-pixel in the first direction and performed on the third sub-pixel in the second direction by the first color filter and the second color filter, and a color separation is performed on the first sub-pixel and the second sub-pixel in the second direction by the third color filter.

(5) The display device according any one of above (2) to (4), in which the sizes of the first portion and the second portion are different from each other.

(6) The display device according to any one of above (2) to (5), in which the second portion is provided on a center portion in the third sub-pixel in the first direction.

(7) The display device according any one of above (2) to (5), in which the second portion is provided on a position different from the center portion in the third sub-pixel in the first direction.

(8) The display device according to above (7), in which, in one pixel, a first pixel area and a second pixel area are formed in the third sub-pixel with the second portion as a boundary, and viewing angle characteristics of the first pixel area and viewing angle characteristics of the second pixel area are different from each other.

(9) The display device according any one of above (2) to (8), in which the light shielding portion has a rectangular shape, an elliptical shape, or a circular shape.

(10) The display device according any one of above (2) to (9), in which the first sub-pixel includes a first light emitting element that emits the first color light, the second sub-pixel includes a second light emitting element that emits the second color light, the third sub-pixel includes a third light emitting element that emits the third color light, and, in one pixel, the third light emitting element is divided at the portion corresponding to the position on which the second portion is provided.

(11) The display device according to above (10), in which, in the second direction, a width of the third light emitting element and a width of the light shielding portion are different from each other.

(12) The display device according any one of above (1) to (11), in which the first color light is emitted from the first sub-pixel, the second color light is emitted from the second sub-pixel, the third color light of which a wavelength is shorter than that of the first color light and the second color light is emitted from the third sub-pixel, and, in the second direction, an opening width of the third sub-pixel is less than an opening width of the first sub-pixel and an opening width of the second sub-pixel.

(13) The display device according to above (1), in which each pixel further includes a fourth sub-pixel that is disposed to be adjacent to the first sub-pixel in the second direction, the third sub-pixel is disposed to be adjacent to the second sub-pixel in the second direction and is disposed to be adjacent to the fourth sub-pixel in the first direction, and the light shielding portion is disposed around the fourth color filter so as to include a boundary portion of the first sub-pixel and the third sub-pixel.

(14) The display device according to above (13), in which the light shielding portion limits the viewing angle of the third sub-pixel in the first direction and limits the viewing angle of the fourth sub-pixel in the first direction and the second direction.

(15) An electronic apparatus including: a display device in which a plurality of pixels is arrayed in a first direction and a second direction, in which each pixel includes; a first sub-pixel, a second sub-pixel that is disposed to be adjacent to the first sub-pixel in the first direction, a third sub-pixel that is disposed to be adjacent to at least one of the first sub-pixel and the second sub-pixel in the second direction, and a light shielding portion that is disposed corresponding to the position on which the third sub-pixel is disposed, so as to limit a viewing angle of the third sub-pixel in the first direction.

It should be understood by those skilled in the art that various modifications, combinations, sub-combinations and alterations may occur depending on design requirements and other factors insofar as they are within the scope of the appended claims or the equivalents thereof.

What is claimed is:
1. A display device comprising:
a plurality of pixels that is arrayed in a first direction and a second direction,
wherein each pixel includes;
a first sub-pixel,
a second sub-pixel that is disposed to be adjacent to the first sub-pixel in the first direction,
a third sub-pixel that is disposed to be adjacent to at least one of the first sub-pixel and the second sub-pixel in the second direction, and a light shielding portion that is disposed corresponding to the position on which the third sub-pixel is disposed and including a first part that is disposed on a boundary between adjacent pixels in the first direction and a second part that is disposed within the third sub-pixel in one pixel, so as to limit a viewing angle of the third sub-pixel in the first direction, and wherein the light shielding portion is not disposed between the first sub-pixel and the second sub-pixel.

2. The display device according claim 1, wherein the third sub-pixel is disposed to be adjacent to both the first sub-pixel and the second sub-pixel in the second direction.

3. The display device according claim 2, wherein a width of the light shielding portion in the second direction is less than an opening width of the third sub-pixel.

4. The display device according claim 2, wherein the first sub-pixel includes a first color filter that transmits a first color light, wherein the second sub-pixel includes a second color filter that transmits a second color light, wherein the third sub-pixel includes a third color filter that transmits a third color light, wherein a color separation is mutually performed on the first sub-pixel and the second sub-pixel in the first direction and performed on the third sub-pixel in the second direction by the first color filter and the second color filter, and wherein a color separation is performed on the first sub-pixel and the second sub-pixel in the second direction by the third color filter.

5. The display device according claim 2, wherein the sizes of the first part and the second part are different from each other.

6. The display device according claim 2, wherein the second part is provided on a center portion in the third sub-pixel in the first direction.

7. The display device according claim 2, wherein the second part is provided on a position different from the center portion in the third sub-pixel in the first direction.

8. The display device according claim 7, wherein, in one pixel, a first pixel area and a second pixel area are formed in the third sub-pixel with the second part as a boundary, and wherein viewing angle characteristics of the first pixel area and viewing angle characteristics of the second pixel area are different from each other.

9. The display device according claim 2, wherein the light shielding portion has a rectangular shape, an elliptical shape, or a circular shape.

10. The display device according claim 2, wherein the first sub-pixel includes a first light emitting element that emits the first color light, wherein the second sub-pixel includes a second light emitting element that emits the second color light, wherein the third sub-pixel includes two third light emitting elements that each emit the third color light, and wherein, in one pixel, the two third light emitting elements are separated by a gap located at a position corresponding to a position on which the second part is provided.

11. The display device according claim 10, wherein, in the second direction, a width of a respective third light emitting element and a width of the light shielding portion are different from each other.

12. The display device according claim 1, wherein the first color light is emitted from the first sub-pixel, wherein the second color light is emitted from the second sub-pixel, wherein the third color light of which a wavelength is shorter than that of the first color light and the second color light is emitted from the third sub-pixel, and wherein, in the second direction, an opening width of the third sub-pixel is less than an opening width of the first sub-pixel and an opening width of the second sub-pixel.

13. The display device according claim 1, wherein each pixel further includes a fourth sub-pixel that is disposed to be adjacent to the first sub-pixel in the second direction, wherein the third sub-pixel is disposed to be adjacent to the second sub-pixel in the second direction and is disposed to be adjacent to the fourth sub-pixel in the first direction, and wherein the light shielding portion is disposed around the fourth color filter so as to include a boundary portion of the first sub-pixel and the third sub-pixel.

14. The display device according claim 13, wherein the light shielding portion limits the viewing angle of the third sub-pixel in the first direction and limits the viewing angle of the fourth sub-pixel in the first direction and the second direction.

15. The display device according to claim 1, wherein the first portion part is discontinuous with the second -portion part.

16. The display device according to claim 1, wherein the light shielding portion is contained within the third sub-pixel.

17. An electronic apparatus comprising:

a display device in which a plurality of pixels is arrayed in a first direction and a second direction, wherein each pixel includes;

a first sub-pixel, a second sub-pixel that is disposed to be adjacent to the first sub-pixel in the first direction, a third sub-pixel that is disposed to be adjacent to at least one of the first sub-pixel and the second sub-pixel in the second direction, and a light shielding portion that is disposed corresponding to the position on which the third sub-pixel is disposed and including a first part that is disposed on a boundary between adjacent pixels in the first direction and a second part that is disposed within the third sub-pixel in one pixel, so as to limit a viewing angle of the third sub-pixel in the first direction, and wherein the light shielding portion is not disposed between the first sub-pixel and the second sub-pixel.

* * * * *